(12) United States Patent
Rice et al.

(10) Patent No.: US 7,912,576 B2
(45) Date of Patent: Mar. 22, 2011

(54) CALIBRATION OF HIGH SPEED LOADER TO SUBSTRATE TRANSPORT SYSTEM

(75) Inventors: Michael R. Rice, Pleasanton, CA (US); Eric A. Englhardt, Palo Alto, CA (US); Robert B. Lowrance, Los Gatos, CA (US); Martin R. Elliott, Round Rock, TX (US); Jeffrey C. Hudgens, San Francisco, CA (US); Kirk Van Katwyk, Tracy, CA (US); Amit Puri, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/245,738

(22) Filed: Oct. 4, 2008

(65) Prior Publication Data

US 2009/0030547 A1  Jan. 29, 2009

Related U.S. Application Data

(62) Division of application No. 10/987,956, filed on Nov. 12, 2004, now Pat. No. 7,433,756.
(60) Provisional application No. 60/520,180, filed on Nov. 13, 2003.

(51) Int. Cl.
*G06F 7/00* (2006.01)
(52) U.S. Cl. ........................... 700/230; 700/213
(58) Field of Classification Search .................. 700/213, 700/218, 228, 230, 245; 198/465.1, 565.4, 198/577, 468.01, 346.1, 346.2, 346.3, 678.1, 198/680, 681, 682, 683, 684, 685, 686, 687.1; 414/217, 935, 940
See application file for complete search history.

(56) References Cited

U.S. PATENT DOCUMENTS

| 4,775,281 | A | 10/1988 | Prentakis |
| 4,805,759 | A | 2/1989 | Rochet et al. |
| 4,951,601 | A | 8/1990 | Maydan et al. |
| 4,986,715 | A | 1/1991 | Asakawa |
| 5,363,867 | A | 11/1994 | Kawano et al. |
| 5,372,241 | A | 12/1994 | Matsumoto |
| 5,382,127 | A | 1/1995 | Garric et al. |
| 5,387,265 | A | 2/1995 | Kakizaki et al. |
| 5,388,945 | A | 2/1995 | Garric et al. |
| 5,464,313 | A | 11/1995 | Ohsawa |

(Continued)

FOREIGN PATENT DOCUMENTS

EP  0 552 756 A1  7/1993

(Continued)

OTHER PUBLICATIONS

Office Action of Chinese Patent Application No. 200410082294.3 dated Sep. 11, 2009.

(Continued)

*Primary Examiner* — Gene Crawford
*Assistant Examiner* — Ramya Prakasam
(74) *Attorney, Agent, or Firm* — Dugan & Dugan

(57) ABSTRACT

In one aspect, a system is disclosed having a substrate carrier loader adapted to load substrate carriers onto a moving conveyor; and a controller coupled to the substrate carrier loader, the controller adapted to assist in at least one of alignment of the substrate carrier loader to the moving conveyor and calibration of the substrate carrier loader to the moving conveyor or a storage location. Numerous other aspects are provided.

20 Claims, 24 Drawing Sheets

U.S. PATENT DOCUMENTS

| | | | |
|---|---|---|---|
| 5,466,109 | A | 11/1995 | Iizuka |
| 5,562,383 | A | 10/1996 | Iwai et al. |
| 5,628,604 | A | 5/1997 | Murata et al. |
| 5,955,857 | A | 9/1999 | Kwon et al. |
| 5,957,648 | A | 9/1999 | Bachrach |
| 5,964,561 | A | 10/1999 | Marohl |
| 5,980,183 | A | 11/1999 | Fosnight |
| 6,052,913 | A * | 4/2000 | Kaneko et al. ............. 33/645 |
| 6,058,740 | A * | 5/2000 | McMaster et al. ........... 65/60.1 |
| 6,079,927 | A | 6/2000 | Muka |
| 6,129,496 | A | 10/2000 | Iwasaki et al. |
| 6,183,186 | B1 | 2/2001 | Howells et al. |
| 6,224,313 | B1 | 5/2001 | Fukushima et al. |
| 6,235,634 | B1 * | 5/2001 | White et al. ............ 438/680 |
| 6,283,692 | B1 | 9/2001 | Perlov et al. |
| 6,390,754 | B2 | 5/2002 | Yamaga et al. |
| 6,398,476 | B1 | 6/2002 | Ando |
| 6,468,021 | B1 | 10/2002 | Bonora et al. |
| 6,506,009 | B1 | 1/2003 | Nulman et al. |
| 6,517,304 | B1 | 2/2003 | Matsumoto |
| 6,579,052 | B1 | 6/2003 | Bonora et al. |
| 6,699,329 | B2 | 3/2004 | Mueller et al. |
| 6,919,001 | B2 | 7/2005 | Fairbairn et al. |
| 6,955,517 | B2 | 10/2005 | Nulman et al. |
| 7,077,264 | B2 | 7/2006 | Rice et al. |
| 7,168,553 | B2 | 1/2007 | Rice et al. |
| 7,230,702 | B2 | 6/2007 | Rice et al. |
| 7,234,584 | B2 | 6/2007 | Rice et al. |
| 7,234,908 | B2 | 6/2007 | Nulman et al. |
| 7,243,003 | B2 | 7/2007 | Elliott et al. |
| 7,346,431 | B2 | 3/2008 | Elliott et al. |
| 7,359,767 | B2 | 4/2008 | Elliott et al. |
| 7,360,981 | B2 | 4/2008 | Weaver |
| 7,409,263 | B2 | 8/2008 | Elliott et al. |
| 7,433,756 | B2 | 10/2008 | Rice et al. |
| 7,491,662 | B2 * | 2/2009 | Takano ............... 438/800 |
| 2002/0090282 | A1 | 7/2002 | Bachrach |
| 2002/0187024 | A1 * | 12/2002 | Nulman ............... 414/217 |
| 2003/0031538 | A1 | 2/2003 | Weaver |
| 2003/0040841 | A1 * | 2/2003 | Nasr et al. ............ 700/245 |
| 2003/0110649 | A1 | 6/2003 | Hudgens |
| 2003/0202865 | A1 | 10/2003 | Ponnekanti et al. |
| 2003/0202868 | A1 | 10/2003 | Bachrach |
| 2004/0081546 | A1 | 4/2004 | Elliott et al. |
| 2005/0040662 | A1 | 2/2005 | Rice et al. |
| 2005/0135903 | A1 | 6/2005 | Rice et al. |
| 2005/0167554 | A1 | 8/2005 | Rice et al. |
| 2006/0013674 | A1 | 1/2006 | Elliott et al. |
| 2006/0072986 | A1 | 4/2006 | Perlov et al. |
| 2007/0237609 | A1 | 10/2007 | Nulman et al. |
| 2007/0258796 | A1 | 11/2007 | Englhardt et al. |
| 2007/0274813 | A1 | 11/2007 | Elliott et al. |
| 2008/0050217 | A1 | 2/2008 | Rice et al. |
| 2008/0051925 | A1 | 2/2008 | Rice et al. |
| 2008/0071417 | A1 | 3/2008 | Rice et al. |
| 2008/0173519 | A1 * | 7/2008 | Ely ............................ 198/456 |
| 2008/0187414 | A1 | 8/2008 | Elliott et al. |
| 2008/0187419 | A1 | 8/2008 | Rice et al. |
| 2008/0213068 | A1 | 9/2008 | Weaver |
| 2008/0286076 | A1 | 11/2008 | Elliott et al. |
| 2009/0188103 | A1 | 7/2009 | Elliott et al. |

FOREIGN PATENT DOCUMENTS

| | | |
|---|---|---|
| JP | 01067932 A | 3/1989 |
| JP | 03244121 A | 10/1991 |
| JP | 04158508 A | 6/1992 |
| WO | WO 98/46503 A1 | 10/1998 |
| WO | WO 99/02436 A1 | 1/1999 |

OTHER PUBLICATIONS

Office Action of U.S. Appl. No. 10/987,956 mailed Dec. 15, 2006.

Apr. 16, 2007 Response to Office Action of U.S. Appl. No. 10/987,956 mailed Dec. 15, 2006.

Final Office Action of U.S. Appl. No. 10/987,956 mailed Jun. 6, 2007.

Nov. 6, 2007 Response to Final Office Action of U.S. Appl. No. 10/987,956 mailed Jun. 6, 2007.

Notice of Allowance of U.S. Appl. No. 10/987,956 mailed Nov. 28, 2007.

Notice of Allowance of U.S. Appl. No. 10/987,956 mailed Jun. 10, 2008.

Notice of Abandonment of U.S. Appl. No. 12/099,780 mailed Feb. 5, 2010.

US 7,099,744, 08/2006, Rice et al. (withdrawn)

* cited by examiner

CALIBRATION OF HIGH SPEED LOADER TO SUBSTRATE TRANSPORT SYSTEM

This application is a division of U.S. patent application Ser. No. 10/987,956, filed Nov. 12, 2004 now U.S. Pat. No. 7,433,756 and titled "CALIBRATION OF HIGH SPEED LOADER TO SUBSTRATE TRANSPORT SYSTEM", which claims priority to U.S. Provisional Patent Application Ser. No. 60/520,180, filed Nov. 13, 2003, titled "CALIBRATION OF HIGH SPEED LOADER TO SUBSTRATE TRANSPORT SYSTEM". The content of each of these applications is hereby incorporated herein by reference in its entirety for all purposes.

CROSS REFERENCE TO RELATED APPLICATIONS

The present application is related to the following commonly-assigned, co-pending U.S. Patent Applications, each of which is hereby incorporated herein by reference in its entirety for all purposes:

U.S. patent application Ser. No. 10/650,310, filed Aug. 28, 2003 and titled "System For Transporting Substrate Carriers";

U.S. patent application Ser. No. 10/650,480, filed Aug. 28, 2003 and titled "Substrate Carrier Handler That Unloads Substrate Carriers Directly From a Moving Conveyor";

U.S. patent application Ser. No. 10/764,982, filed Jan. 26, 2004 and titled "Methods and Apparatus for Transporting Substrate Carriers"; and U.S. patent application Ser. No. 10/764,820, filed Jan. 26, 2004, and titled "Overhead Transfer Flange and Support for Suspending Substrate Carrier".

FIELD OF THE INVENTION

The present invention relates to semiconductor device manufacturing and more particularly to the calibration of a high speed loader to a substrate transport system.

BACKGROUND OF THE INVENTION

Manufacturing of semiconductor devices typically involves performing a sequence of procedures with respect to a substrate such as a silicon wafer, a glass plate, a mask, a reticule, etc. These steps may include polishing, deposition, etching, photolithography, heat treatment, and so forth. Usually a number of different processing steps may be performed in a single processing system "tool" which includes a plurality of processing chambers. However, it is generally the case that other processes are required to be performed at other processing locations within a fabrication facility, and it is accordingly necessary that substrates be transported within the fabrication facility from one processing location to another. Depending upon the type of semiconductor device to be manufactured, there may be a relatively large number of processing steps required, to be performed at many different processing locations within the fabrication facility.

It is conventional to transport substrates from one processing location to another within substrate carriers such as sealed pods, cassettes, containers and so forth. It is also conventional to employ automated substrate carrier transport devices, such as automatic guided vehicles, overhead transport systems, substrate carrier handling robots, etc., to move substrate carriers from location to location within a fabrication facility or to transfer substrate carriers from or to a substrate carrier transport device.

Previously incorporated U.S. patent application Ser. No. 10/650,310, filed Aug. 28, 2003, entitled "System for Transporting Semiconductor Substrate Carriers", discloses a substrate carrier transport system that includes a conveyor for substrate carriers that is intended to be constantly in motion during operation of the fabrication facility which it serves. The constantly moving conveyor is intended to facilitate transportation of substrates within the fabrication facility.

Previously incorporated U.S. patent application Ser. No. 10/650,480 filed Aug. 28, 2003, entitled "Substrate Carriers Handler that Unloads Substrate Carriers Directly from a Moving Conveyor", discloses a high speed substrate carrier transfer station equipped with a substrate carrier handler for unloading substrate carriers from, and loading substrate carriers onto such a substrate carrier transport system. In one embodiment, the substrate carrier transfer station comprises a substrate carrier handler that includes a horizontal guide that is moveable along parallel vertical guides, and an end effector that is moveable horizontally along the horizontal guide. To unload a substrate carrier from a moving conveyor that transports substrate carriers and that passes adjacent to the high speed substrate carrier transfer station, the end effector is moved along the horizontal guide at a velocity that substantially matches that of the substrate carrier (e.g., by substantially matching substrate carrier speed in a horizontal direction). The end effector may also substantially match a position of the substrate carrier while substantially matching a velocity of the substrate carrier. When so matching, the end effector may be raised by moving the horizontal guide upwardly along the vertical guides, so that the end effector contacts and lifts the substrate carrier from the substrate carrier transporter. A substrate carrier may similarly be loaded onto the moving substrate carrier conveyor by substantially matching end effector and conveyor velocities (and/or positions) during loading.

Efficiency gains may be achieved via increasing the common speed of the end effector and the substrate carrier during such transfers, which underscores a need for precise and efficient interaction between separately supported and separately driven portions of the system.

SUMMARY OF THE INVENTION

In a first aspect, a system is provided including a substrate carrier loader adapted to load substrate carriers onto a moving conveyor, and a controller coupled to the substrate carrier loader, the controller adapted to assist in at least one of alignment of the substrate carrier loader to the moving conveyor and calibration of the substrate carrier loader to the moving conveyor or a storage location.

In another aspect, a system is provided including a substrate carrier loader adapted to load substrate carriers onto a moving conveyor, and a controller coupled to the substrate carrier loader, the controller adapted to assist in alignment of the substrate carrier loader to the moving conveyor in at least two orientations selected from a group consisting of a pitch orientation, a yaw orientation, and a vertical orientation.

In another aspect, a system is provided including a substrate carrier loader adapted to load substrate carriers onto a moving conveyor from a storage location, a controller coupled to the substrate carrier loader, the controller adapted to assist in calibration of the substrate carrier loader to the moving conveyor or a storage location, and a sensor coupled to the controller and adapted to generate signals to be received by the controller wherein the signals are generated in response to detecting detectable features provided on the moving conveyor or the storage location.

Numerous other aspects are provided in accordance with these and other aspects of the invention. Other features and aspects of the present invention will become more fully apparent from the following detailed description, the appended claims and the accompanying drawings.

DETAILED DESCRIPTION

In accordance with at least one aspect of the present invention, a high-speed substrate carrier transfer station (with or without substrate carrier storage) is aligned and calibrated to a substrate carrier transport system. The substrate carrier hand-off function of the transfer station may then be tested, and the high-speed transfer station is placed into service for at least that function.

In accordance with another aspect of the present invention, in addition to being aligned to the substrate carrier transport system, the high-speed transfer station may also be aligned and calibrated to a factory interface of a substrate loading station that transfers substrates back and forth between the transfer station and one or more loadlocks of a substrate processing tool for processing of the substrates. In accordance with a further aspect of the invention, the above alignment, calibration and testing may be performed while the substrate carrier transport system is in motion and transporting substrate carriers. In accordance with a still further aspect of the invention, the above alignment, calibration and testing may be performed without requiring any contact with the substrate carrier transport system prior to the high-speed substrate carrier transport station being placed into service (whether or not the substrate carrier transport system is in motion).

System Apparatus Overview

Figure 1A:
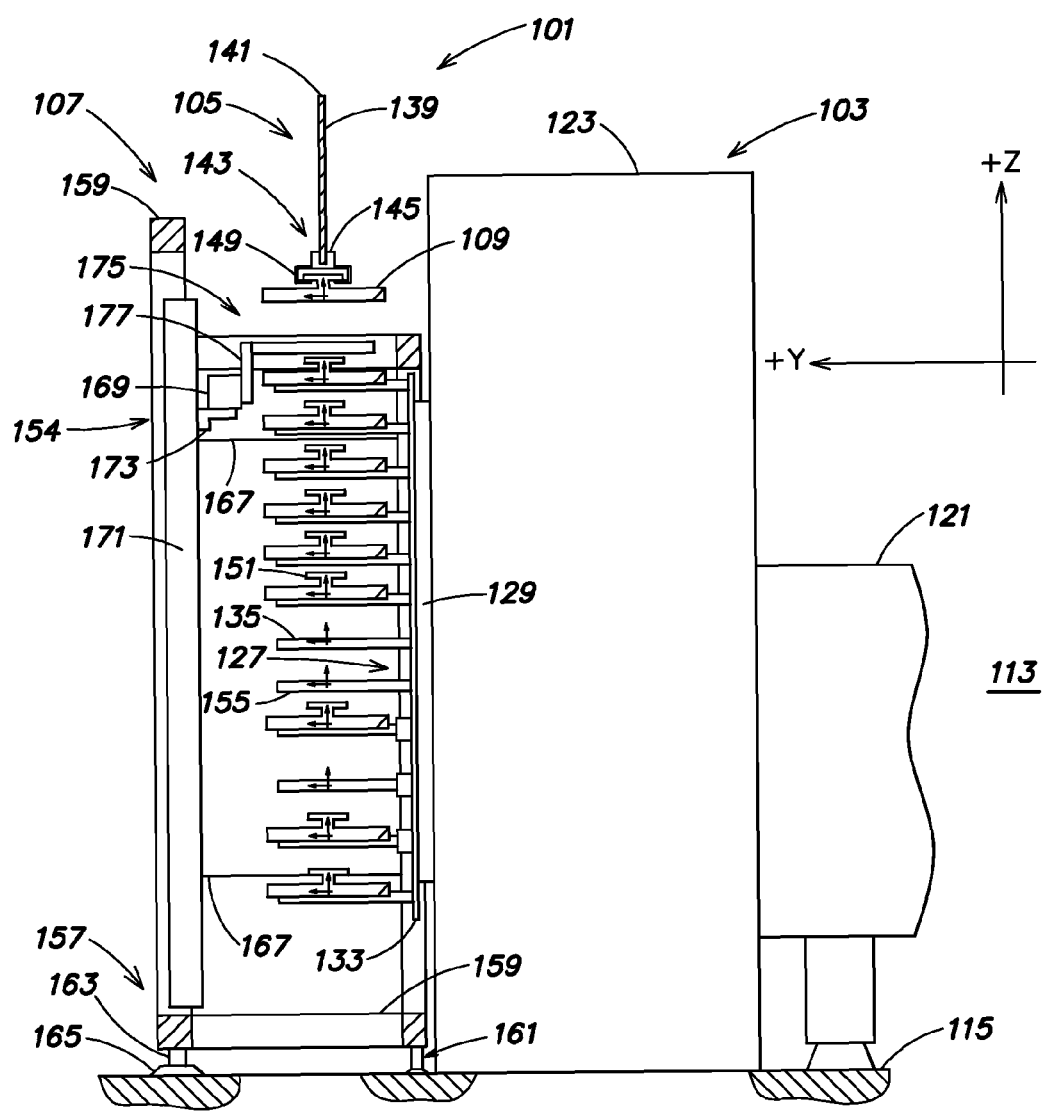
FIG. 1A is a side schematic view of a wafer transport processing system provided in accordance with the present invention.
Figure 1B:
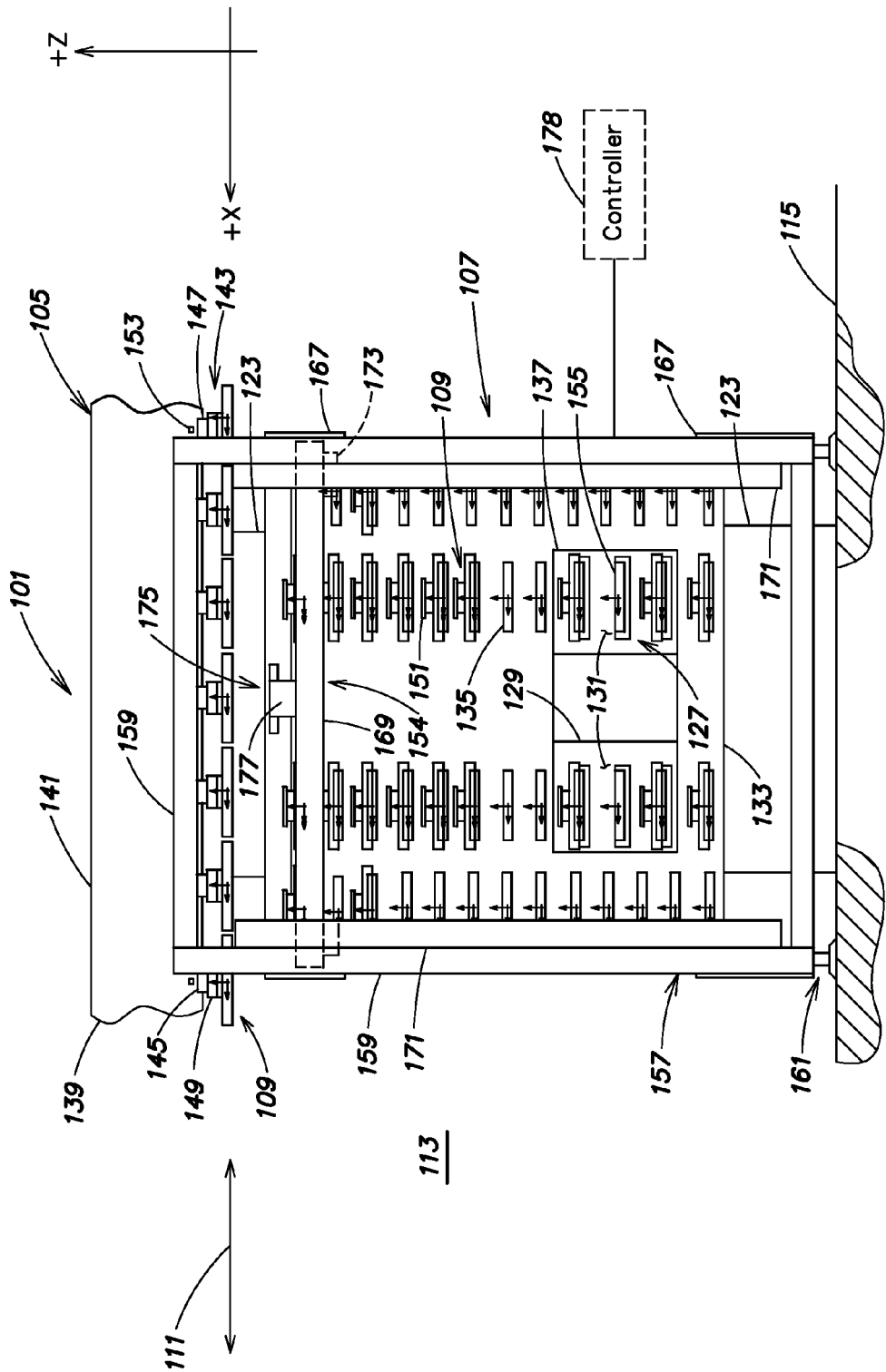
FIG. 1B is a front schematic view of the system of FIG. 1A.
Figure 1C:
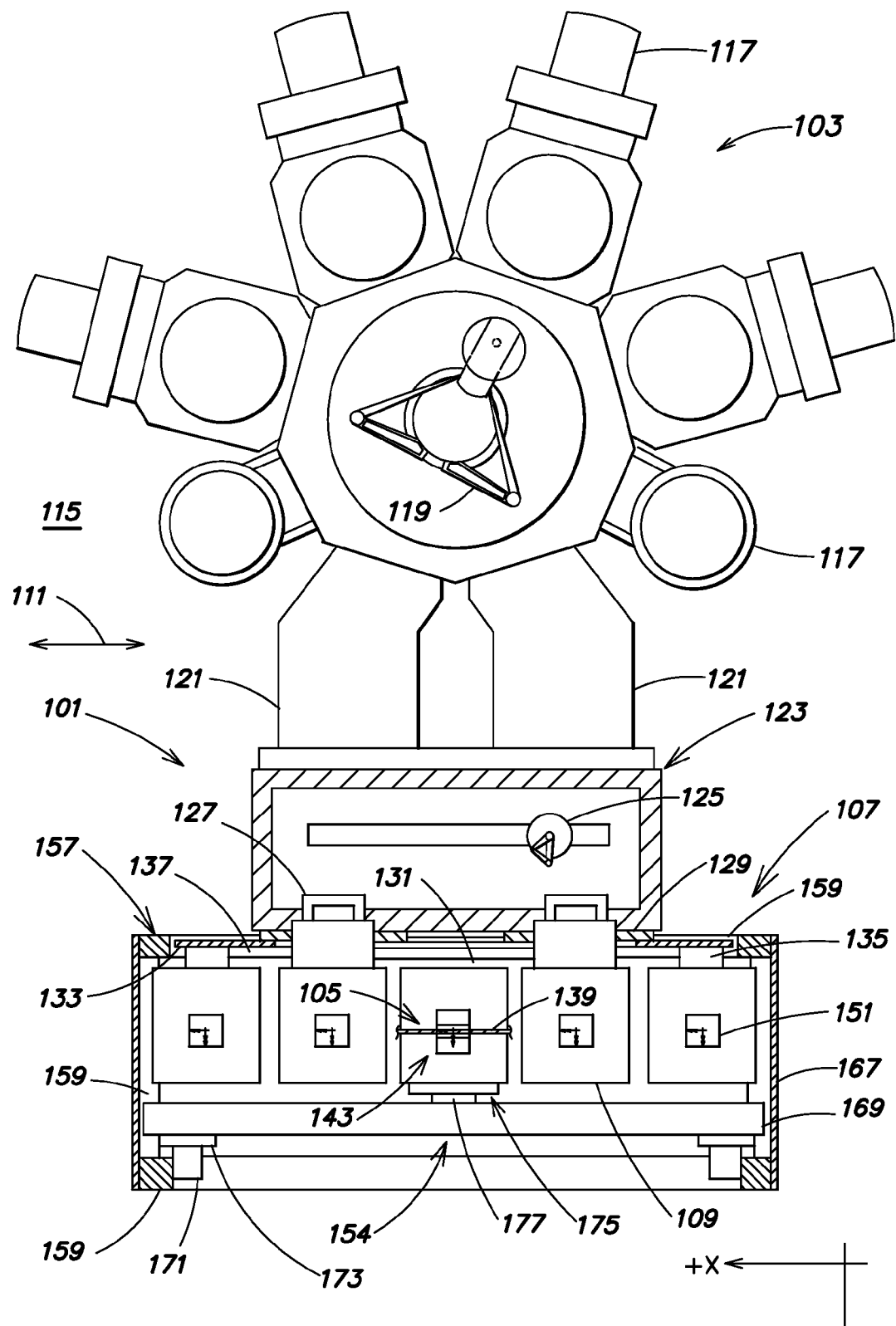
FIG. 1C is a top schematic view of the system shown in FIG. 1B.

FIG. 1A is a side schematic view of a wafer transport processing system 101. FIG. 1B is a front schematic view of the system 101 of FIG. 1A. Note the loading station of the system 101 has both docking stations and storage locations, making the loading station both a wafer loading and wafer carrier storage station. FIG. 1C is a top schematic view of the system 101 shown in FIG. 1B. The following is a basic description of the system 101 which is best understood when read with reference to FIGS. 1A-1C.

The system 101 comprises a wafer processing tool 103, a wafer carrier transport system 105 (or WCTS), and a high-speed loader 107 (or HSL). The wafer carrier transport system 105 is adapted to transport a plurality of wafer carriers 109 in the +x direction through a first path 111 within at least a portion of a manufacturing facility 113 (FIG. 1A). Although not necessary, preferably, the first path portion 111 through which the wafer carrier transport system 105 is adapted to transport wafer carriers 109 is elevated above a floor 115 of the manufacturing facility 113 and is straight and parallel to the horizon. Also preferably, the high-speed loader 107 is situated on (e.g., resting on) the floor 115 of the manufacturing facility 113, and is adapted to remove wafer carriers 109 from, and load wafer carriers 109 onto, the wafer carrier transport system 105, preferably while the wafer carrier transport system 105 is in motion.

As shown in FIG. 1C, the wafer processing tool 103 may comprise a plurality of radially-arranged wafer processing chambers 117, a robot 119 adapted to insert wafers into each wafer processing tool 117 and remove wafers from each wafer processing tool 117, at least one loadlock 121, and a factory interface 123 (or FI). The factory interface 123 comprises a robot 125 adapted to transfer wafers between the high-speed loader 107 and a loadlock 121 of the wafer processing tool 103 via a plurality of docking stations 127 of the factory interface 123.

The factory interface 123 also may comprise at least one datum plate 129 adapted to provide a datum surface 131 that may be substantially flat, perpendicular to the horizon, and parallel to the first path portion 111 through which the wafer carrier transport system 105 is adapted to transport the wafer carriers 109. The factory interface 123 may comprise at least one storage location support panel 133 fastened to the datum surface 131 of the datum plate 129, and a plurality of stationary wafer carrier storage locations 135, each wafer carrier storage location 135 being mounted to a shelf support panel 133 such that each wafer carrier storage location 135 occupies a position either above, beside, or below the preferably centrally-located docking stations 127. A gap 137 may exist in the support panel 133 to permit each docking station 127 to extend out from the datum plate 129 and toward the high-speed loader 107, preferably in a direction that is substantially perpendicular to the datum surface 131. Each wafer carrier storage location 135 may extend outward from the support panel 133 and toward the high-speed loader 107, also preferably in a direction that is substantially perpendicular to the datum surface 131.

The first path portion 111 through which the wafer carrier transport system 105 is adapted to transport wafer carriers 109 may form a portion of a longer continuous path (not shown) through the manufacturing facility 113 that may comprise a substantially horizontally-oriented loop (not shown). In at least one embodiment, the wafer carrier transport system 105 comprises a relatively thin vertically-oriented band 139. The band 139 of the wafer carrier transport system 105 is supported at or near a top portion 141 of the band 139 (e.g., via a horizontally-oriented flange (not shown) that can comprise a folded portion of the band 139, a separate part fastened to the band 139 or a similar configuration). Only a portion of the band 139, which preferably comprises a continuous horizontally-oriented loop (not shown), is shown in FIGS. 1A-1C. The wafer carrier transport system 105 may be adapted to move and guide the band 139 such that the band 139 rotates through a horizontally-oriented loop (not shown) that remains fixed relative to the floor 115 of the manufacturing facility 113.

Each wafer carrier 109 may be adapted to be supported by and to depend from the band 139 of the wafer carrier transport system 105. The wafer carrier transport system 105 may comprise a plurality of wafer carrier support members 143 coupled to the band 139, preferably in a series arrangement along the length of the band 139. Each wafer carrier support member 143 is adapted to hold a wafer carrier 109 in a discrete location along the length of the band 139, whether the band 139 is moving or motionless. Each wafer carrier support member 143 may comprise a band interface portion 145 via which the wafer carrier support member 143 is adapted to couple to the band 139 of the wafer carrier transport system 105, preferably at or near a bottom portion 147 of the band 139. Each wafer carrier support member 143 may also comprise a flange support element 149 adapted to receive and retain a flange 151 of a wafer carrier 109.

The flange support element 149 of the wafer carrier support member 143 is preferably centered beneath the bottom portion 147 the band 139.

The wafer carrier transport system 105 further comprises a plurality of detectable features 153 (FIG. 1B) located at discrete fixed positions along the length of the band 139. Preferably, the detectable features 153 are arranged in series along the band 139. Each detectable feature 153 may be detected by one or more sensors as described below (e.g., non-contact or remote-sensors). Each detectable feature 153 is further preferably positioned along the length of the band 139 so as to correspond to a position of a particular band interface portion 145 (of a particular wafer carrier support member 143) of the wafer carrier transport system 105. If the band interface portion 145 to which a particular detectable feature 153 corresponds also supports a wafer carrier 109, the position of that particular detectable feature 153 shall then also correspond to the position of the wafer carrier 109 supported by the band 139.

The above-referenced high-speed loader 107 comprises a high-speed wafer carrier handler 154 adapted to remove wafer carriers 109 from, and to load wafer carriers 109 onto, wafer carrier support members 143 of the wafer carrier transport system 105 (e.g., while the band 139 of the wafer carrier transport system 105 is in motion, such as while the wafer carrier transport system 105 is transporting other wafer carriers 109 in the +x direction through at least the first path portion 111). The high-speed wafer carrier handler 154 also may place wafer carriers 109 on, and remove wafer carriers 109 from: (1) a wafer carrier storage location 135; and/or (2) a docking station 127 of the HSL 107.

The high-speed loader 107 further comprises a frame 157 adapted to support the high-speed wafer carrier handler 154 and establish and maintain a suitable orientation of the high-speed wafer carrier handler 154 such that the high-speed wafer carrier handler 154 can perform the above-described wafer carrier placement and removal functions smoothly and repeatably. To this end, the frame 157 may comprise interconnected beams 159 which are relatively stiff and strong so as to reduce the potential for load-induced flexure in the frame 157.

The frame 157 may be adapted to be adjusted as to overall y-axis elevation relative to the wafer carrier transport system 105 suspended above the high-speed loader 107. To this end, the frame 157 may comprise elevation adjusting apparatus, such as a plurality of elevation-adjusting legs 161 shown in FIGS. 1A-1B. Each leg 161 preferably comprises a limb 163 and a foot 165, the limb 163 being adapted to selectably adjustably extend out from within a beam 159 of the frame 157, and the foot 165 being adapted to be seated on the floor 115 of the manufacturing facility 113 and to capture (e.g., pivotally) an end of the limb 163 extending from the beam 159. Preferably the frame 157 comprises at least four legs 161, each leg 161 being located at one of four corners of the frame 157. Those with skill in the art will recognize that through the use of each leg 161 in a four-corner arrangement, a high degree of adjustability to the elevation, pitch (e.g., y-axis rotation) and roll (e.g., x-axis rotation) of the frame 157 is readily achievable. As well, the posture of the frame 157 itself can be adjusted for horizontal level or alignment with the vertical, as described further below. Furthermore, the orientation of the high-speed wafer carrier handler 154 of the high-speed loader 107 can also be adjusted in this manner.

The frame 157 also may comprise a plurality of plates 167. For example, the plates 167 may be directly affixed to at least two of the beams 159 where those beams 159 meet, and adapted to enhance the overall stiffness of the frame 157.

The high-speed wafer carrier handler 154 may comprise a horizontal guide 169 that is moveable vertically along two vertical guides 171. The horizontal guide 169 is mounted to each of the vertical guides 171 via a mounting bracket 173. The high speed wafer carrier handler 154 further comprises an end effector 175 that is moveable horizontally along the horizontal guide 169. The end effector 175 is mounted to the horizontal guide 169 via a mounting plate 177. The end effector 175 is adapted to receive a wafer carrier 109 and to securely support that wafer carrier 109 (e.g., from therebeneath) whether the end effector 175 is at rest or is moving (either vertically, or horizontally, or both vertically and horizontally) in the x-z plane of FIG. 1A.

A controller 178 (shown in phantom in FIG. 1B) may be provided for controlling some or all of the operations of the wafer transport processing system 101, including automating all or a portion of the calibration of the high speed loader 107 to the wafer carrier transport system 105 as described further below. The controller 178 may comprise one or more appropriately programmed computers, microcontrollers or the like, logic hardware, or a combination of the same.

Figure 2:
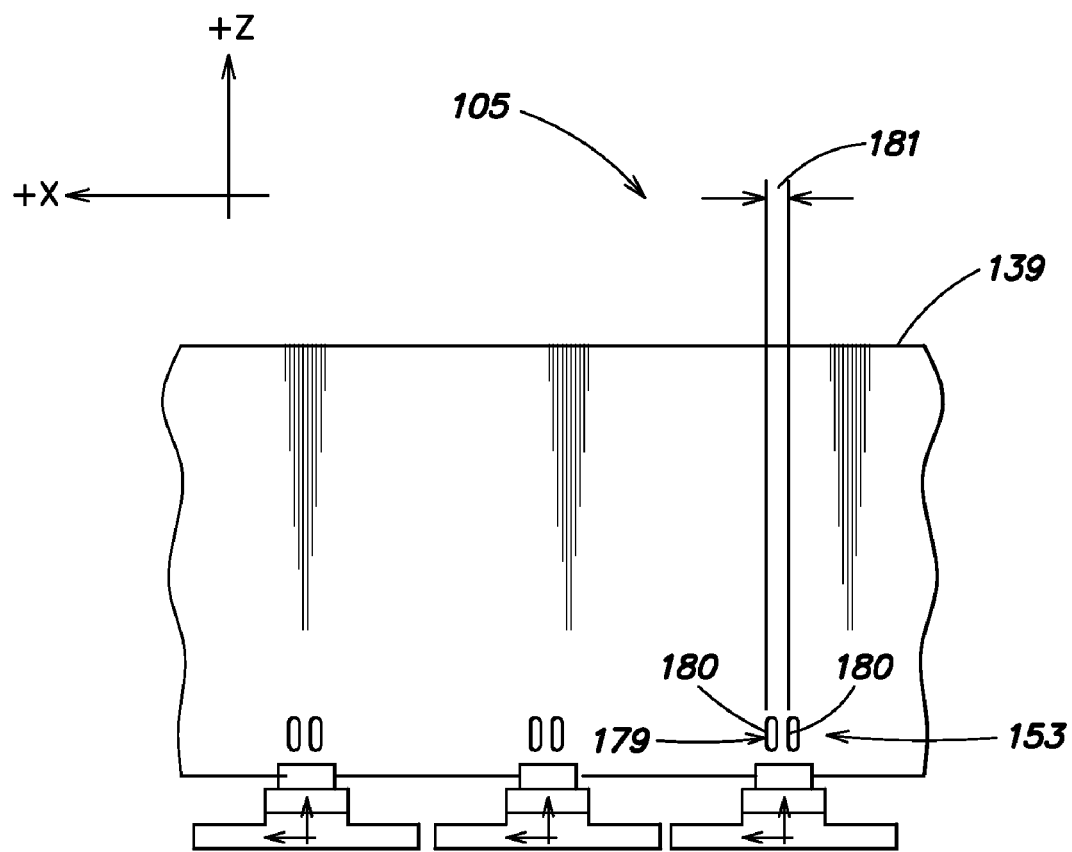
FIG. 2 is a side schematic view of the wafer carrier transport system of FIGS. 1A-1C that depicts an embodiment of a detectable feature.

FIG. 2 is a side schematic view of the wafer carrier transport system 105 that depicts an embodiment of the detectable feature 153. Each detectable feature 153 preferably comprises a plurality of slots 179. The two slots 179 shown in FIG. 2 comprise holes that perforate the band 139 and have leading edges 180 that are substantially parallel to each other and substantially perpendicular to the +x direction of rotation of the band 139. A distance 181 separates the leading edges 180 of the slots 179 and is measured along the +x direction of rotation of the band 139. The distance 181 is preferably carefully controlled so as to facilitate an accurate measurement of a speed of rotation of the band 139 in the +x direction as will be explained further below.

Figure 3:
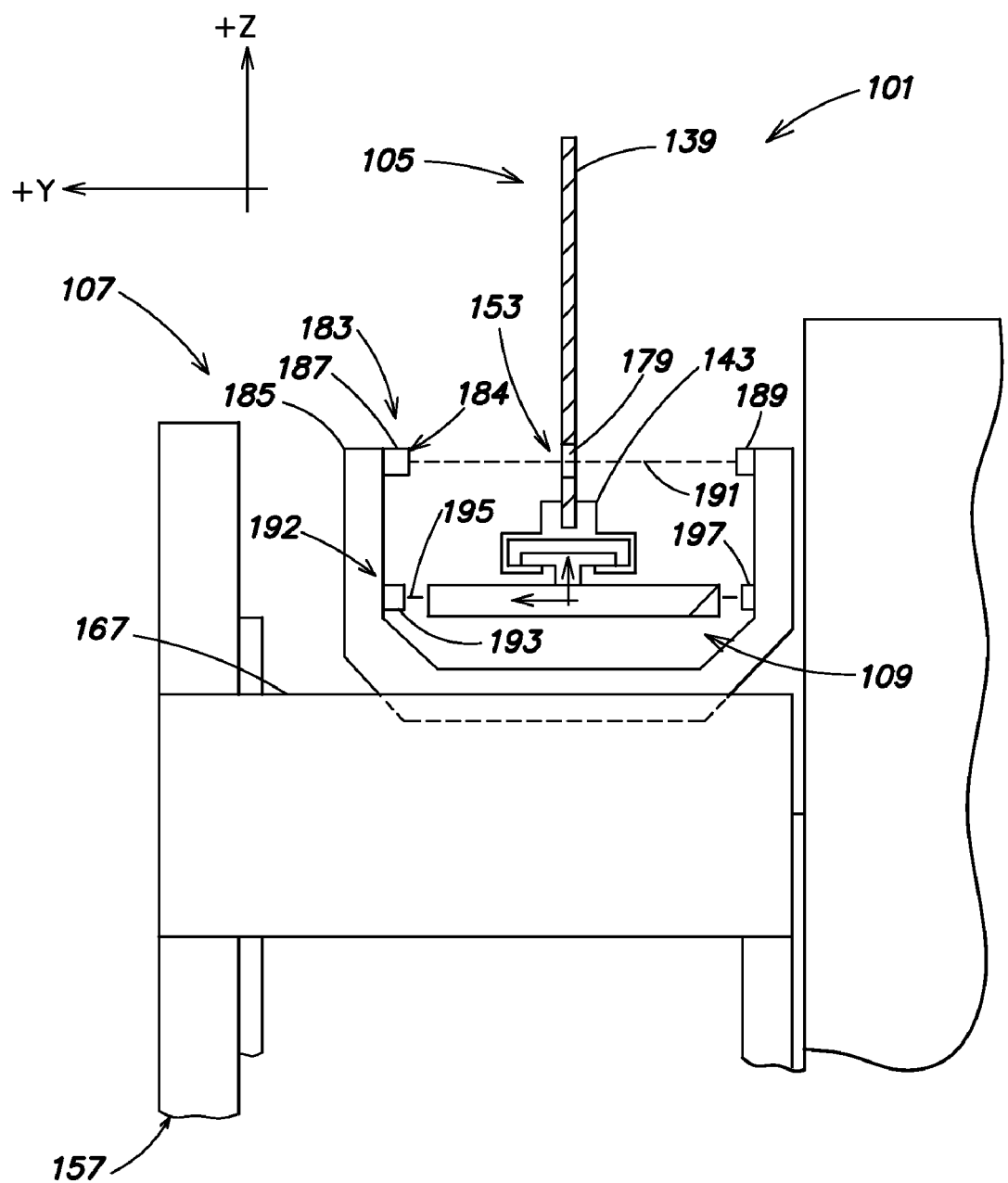
FIG. 3 is a side schematic view of an upper portion of the wafer carrier processing system of FIGS. 1A-1C that shows an embodiment of a high-speed loader that includes a launch sensor assembly.

FIG. 3 is a side schematic view of an upper portion of the wafer carrier processing system 101 that shows an embodiment of the high-speed loader 107 that includes a launch sensor assembly 183 comprising a launch sensor 184. The launch sensor 184 is preferably adapted to detect each slot 179 of each detectable feature 153, and to generate and transmit a signal corresponding to each detection of a slot 179. Thus the launch sensor 184 would provide a detection signal for the detectable feature 153 that comprises two detection signals corresponding to the two slots 179. Those with skill in the art will recognize that if the distance 181 (FIG. 2) between the slots 179 is known and is subject to a tight tolerance, an instantaneous speed of rotation of the band 139 in the +x direction over the high-speed loader 107 may readily be determined based on the two-part signal generated in response to the movement of the detectable feature 153 past the launch sensor assembly 183.

The launch sensor assembly 183 of FIG. 3 further comprises a frame 185 to which the launch sensor 184, which comprises a first light source 187 and a first detector 189, is affixed. The light source 187 is adapted to project a first beam of light 191, and the detector 189 is aligned with the light source 187 so as to detect the beam of light 191 when the band 139 does not obstruct the beam of light 191. Because the light source 187 and detector 189 of the launch sensor 184 occupy an elevation relative to the wafer carrier transport system 105 corresponding to that of the plurality of detectable features 153, each detectable feature 153 represents a removal of the obstruction caused by the band 139. As such, as each detectable feature 153 reaches the beam of light 191 it permits the beam of light 191 to reach the detector 189, and thus detection of the detectable feature 153 is accomplished.

As described above, each detectable feature 153 corresponds to a wafer carrier support member 143, and so the detection of a detectable feature 153 amounts to the detection of a wafer carrier support member 143. The wafer carrier support member 143 is adapted to support and hold a wafer carrier 109 in a fixed position along the length of the band 139, so it is apparent that the instantaneous longitudinal position of a wafer carrier 109 supported by the wafer carrier support member 143 will also have been ascertained.

The launch sensor assembly 183 also preferably comprises a wafer carrier sensor 192 comprising a second light source 193 affixed to the frame 185 and adapted to project a second beam of light 195, and a second detector 197 affixed to the frame 185 and aligned with the light source 193 and adapted to detect the beam of light 195. The wafer carrier sensor 192 is adapted to detect a wafer carrier 109 (when a wafer carrier 109 passes the wafer carrier sensor 192) based on an interruption of the beam of light 195 between the light source 193 and the detector 197.

The frame 185 may be coupled to the frame 157 via a plate 167 that passes beneath the wafer carrier transport system 105 and is located at a side of the high-speed loader 107 that is upstream relative to the flow of wafer carriers 109 being transported over the high-speed loader 107 by the wafer carrier transport system 105 (see the upper-right plate 167 of FIG. 1A). The connection between the frame 185 and the plate 167 is preferably hinged so that the launch sensor assembly 183 may be folded within the frame 157 during gross movement of the frame 157 below the wafer carrier transport system 105 (e.g., during installation of the high-speed loader 107). Once the legs 161 are properly situated and the frame 157 is at least roughly aligned beneath the wafer carrier transport system 105, the frame 185 of the launch sensor assembly 183 can be swung upward so that the launch sensor 184 assumes the orientation shown in FIG. 3.

In one embodiment of the wafer carrier processing system 101, the controller 178 (FIG. 1B) may be adapted to receive signals from the launch sensor 184 and adapted to determine from signals received from the launch sensor 184, a substantially instantaneous speed of rotation of the band 139 in the +x direction. In accordance with that embodiment, the launch sensor 184 generates a two-pulse signal as the detectable feature 153 passes the launch sensor 184, each pulse of the two-pulse signal including an indication that a leading edge 180 of a slot 179 has just passed the beam of light 191, and that the perforation formed by the slot 179 is permitting the beam of light 191 to reach the detector 189. Upon detecting the beam of light 191, the detector 189 preferably generates and transmits an indicating pulse to the controller 178 in real time (e.g., the difference in time between the edge 180 reaching the beam of light 191 and the controller 178 receiving the indicator pulse is negligibly small for the purposes of the wafer carrier processing system 101), and the controller 178 notes the precise time it receives the indicator pulse. Of course, the passage of the detectable feature 153 will result in the controller 178 receiving two such pulses separated in time but in close succession.

The controller 178 may subtract the time of the first pulse from the time of the second pulse to determine an inter-pulse time interval, and then may determine the speed of rotation of the band 139 based on the distance 181 and the inter-pulse time interval. Those with skill in the art will recognize that a controller may be caused to so determine the speed of rotation of the band 139 in a number of different ways. For example, the controller 178 may calculate the speed by dividing the distance 181 by the inter-pulse time interval. Alternatively, the controller 178 may make reference to a look-up table to perform the conversion, the look-up table being adapted to provide pre-calculated speed indications based on a constant distance 181. Additionally, a direct measure of band speed may be employed (e.g., via an encoder or the like).

It is apparent that if the distance 181 associated with each pair of detectable features 153 is held to within a sufficiently tight tolerance of a known nominal distance value, and if that nominal distance value is relatively short (e.g., as compared to the length of a wafer carrier 109, or as compared to the distance between mounting positions of successive wafer carrier support members 143), the speed value so determined will be very close to an actual instantaneous speed of rotation of the band 139. This will be particularly true if the wafer carrier transport system 105 is operated so as to provide a relatively constant speed of rotation for the band 139 over a long period of time.

Figure 4:
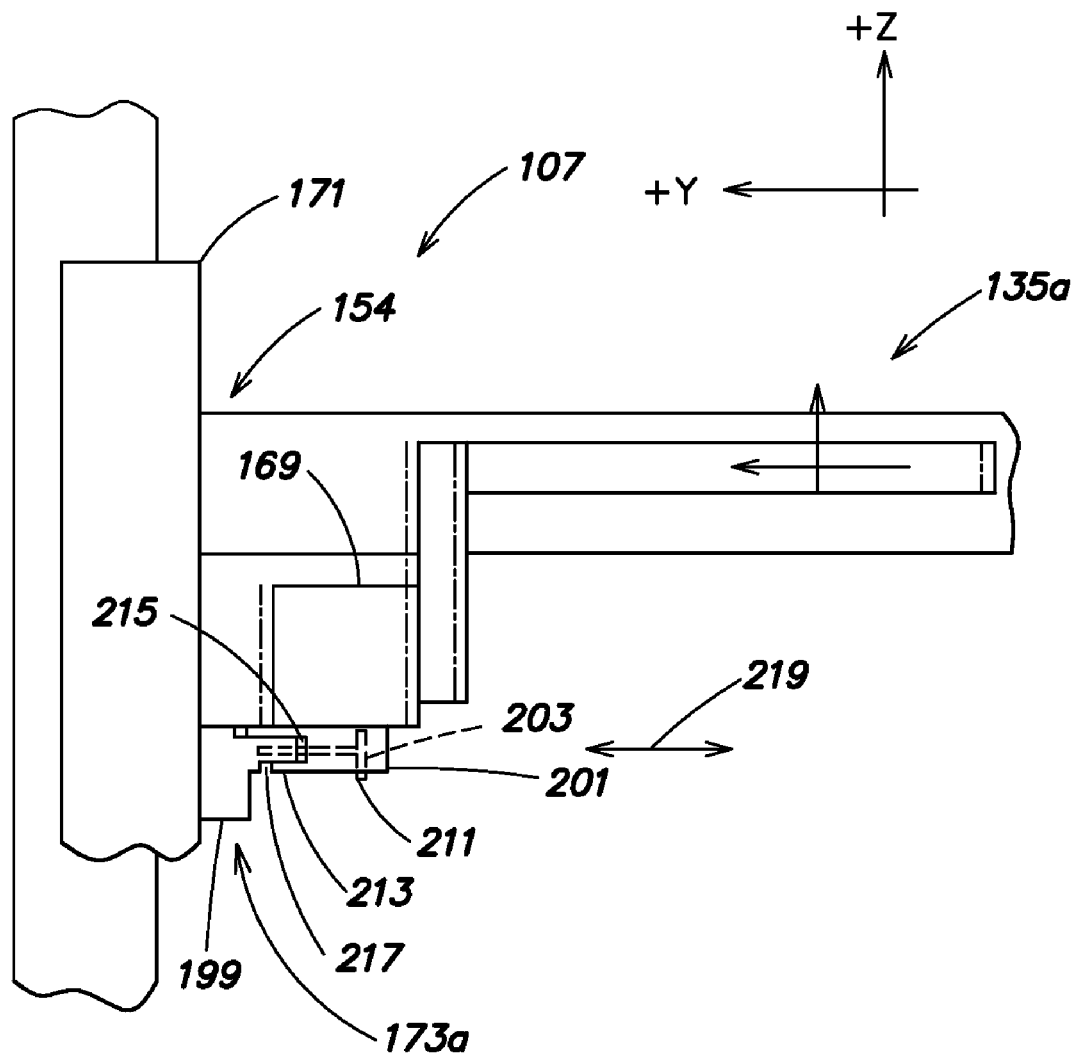
FIG. 4 is a side schematic view of the high-speed wafer carrier handler of a high-speed loader that illustrates an exemplary embodiment of a mounting location of FIGS. 1A-1C.

FIG. 4 is a side schematic view of the high-speed wafer carrier handler 154 of the high-speed loader 107 that illustrates an exemplary embodiment 135a of the mounting location 135 of FIGS. 1A-1C. As before, the horizontal guide 169 is mounted to the vertical guide 171 via the mounting location 135a for vertical motion along the vertical guide 171. However, the mounting location 135a may also be adapted to permit the y-axis position of the horizontal guide 169 relative to the vertical guide 171 to be incrementally increased or decreased as necessary, e.g., for purposes of fine-scale alignment of the horizontal guide 169 with the first path portion 111 (FIG. 1B) through which the wafer carrier transport system 105 (FIG. 1B) is adapted to move the wafer carriers 109 (FIG. 1B).

As shown in FIG. 4, the mounting location 135a may comprise a first shelf portion 199 moveably coupled to the vertical guide 171, and a second shelf portion 201 fixedly coupled to the horizontal guide 169, and a thumbscrew 203 or other suitable mechanism. The thumbscrew 203 is embedded within the second shelf portion 201 and is adapted to permit the second shelf portion 201 to move back and forth relative to the first shelf portion 199 along the y-axis, as indicated by the two-headed arrow 219. As the thumbscrew 203 is turned, the second shelf portion 201 moves along the y-axis. Preferably, the horizontal guide 169 will be mounted to each of the vertical guides via a mounting bracket 173a. Those skilled in the art will recognize that many potential configurations of a mounting location 135 exist in addition to the mounting location 135a of FIG. 4 that will provide y-axis adjustment for the horizontal guide 169 relative to the vertical guide 171.

Figure 5:
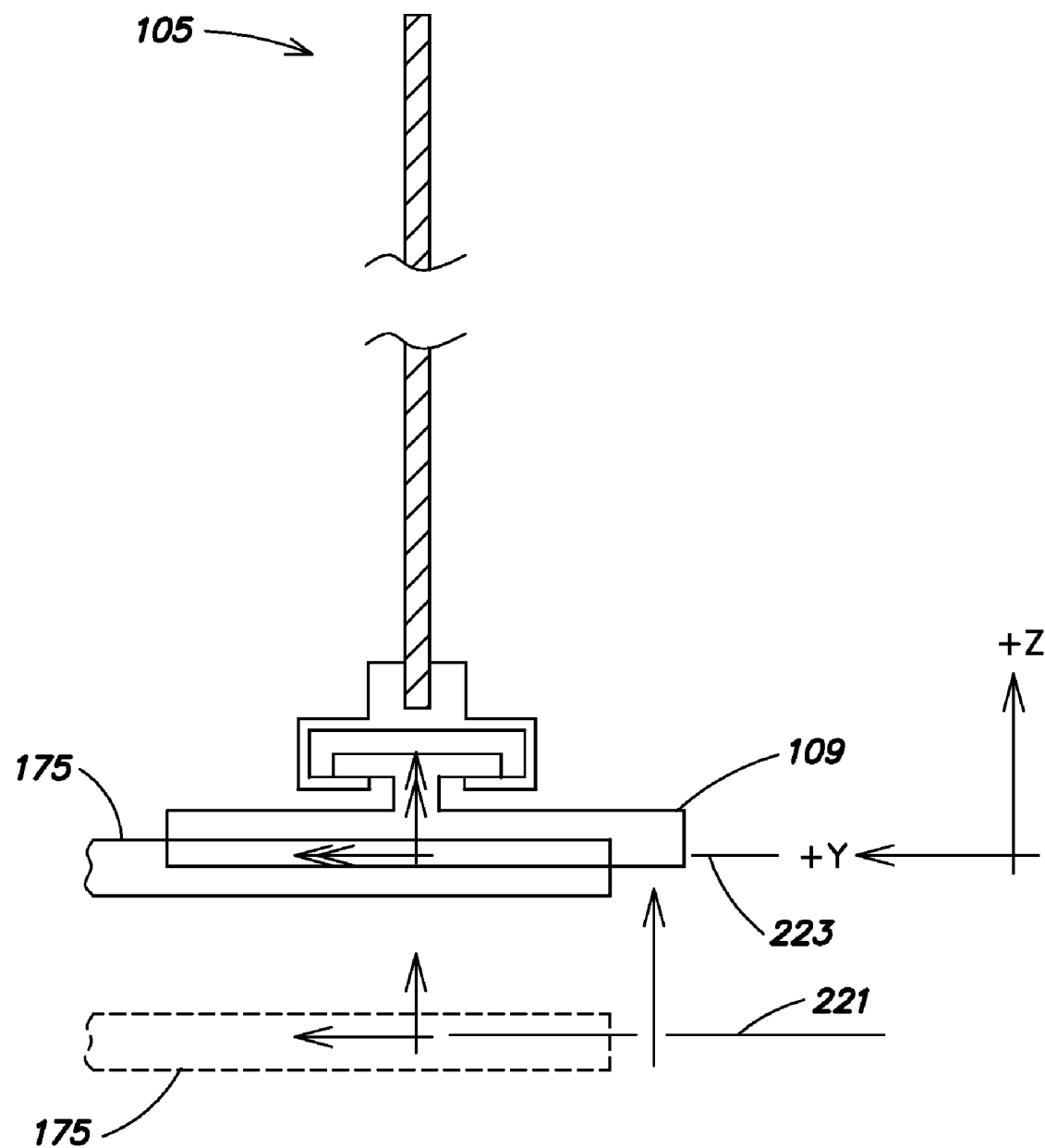
FIG. 5 is a schematic side view illustrating an end effector rising to mate with a wafer carrier as the wafer carrier is supported by the wafer carrier transport system of FIGS. 1A-1C.

FIG. 5 is a schematic side view illustrating an end effector 175 rising to mate with a wafer carrier 109 as the wafer carrier 109 is supported by the wafer carrier transport system 105 (e.g., during unloading of the wafer carrier 109 from the wafer carrier transport system 105). The end effector 175 begins at a first elevation 221 relative to the wafer carrier transport system 105 (as shown in phantom) and rises in the direction of the z-axis to a second elevation 223 relative to the wafer carrier transport system 105 shared by a wafer carrier 109, where a kinematic interface (not shown) at the top of the end effector 175 may mate with a kinematic interface (not shown) at the bottom of the wafer carrier 109. A similar operation may be performed for loading a wafer carrier 109 onto the wafer carrier transport system 105.

Basic Process

Figure 6:
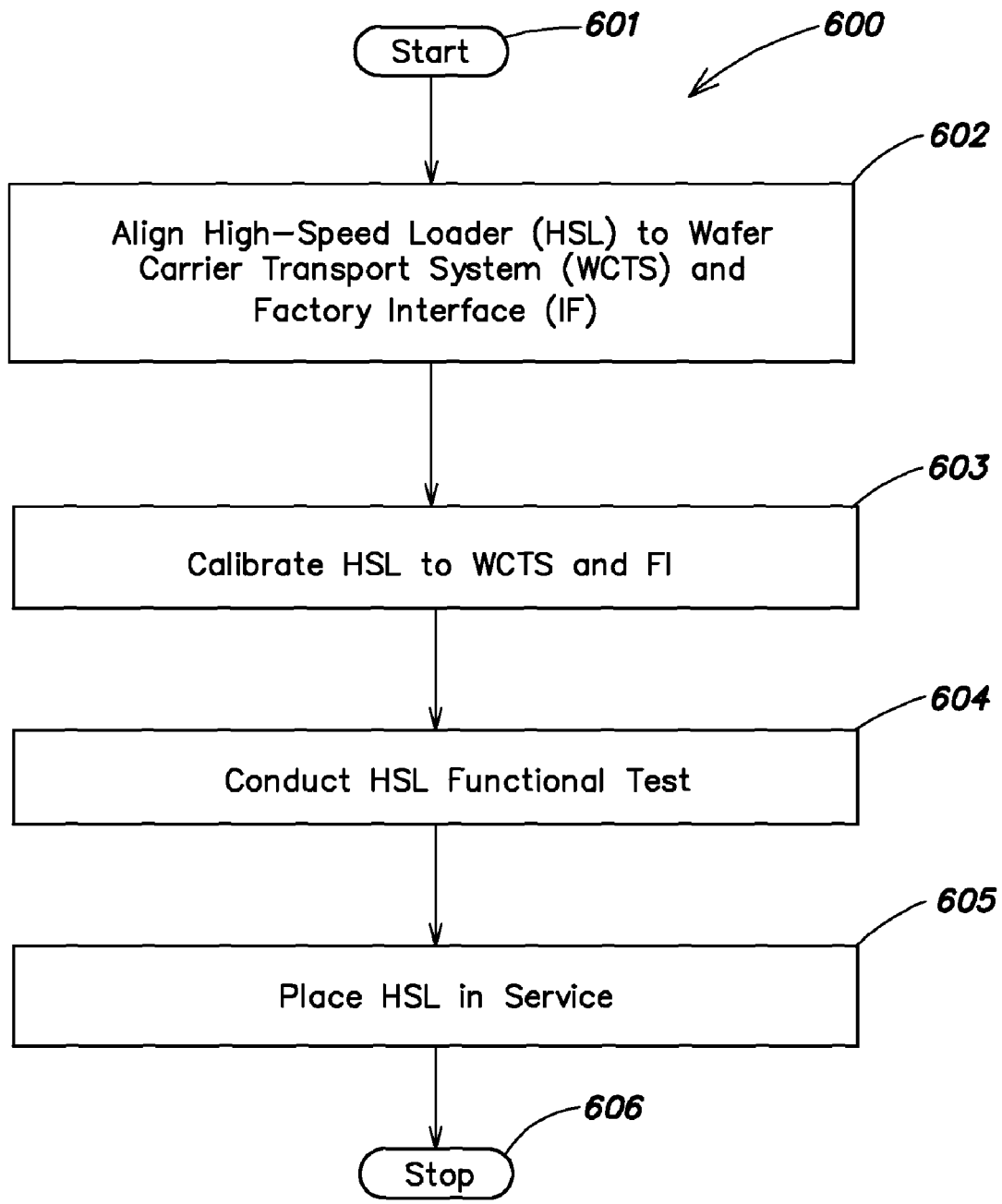
FIG. 6 illustrates a flowchart of an exemplary process for installing a high-speed loader as part of an overall wafer carrier processing system in accordance with an embodiment of the present invention.

FIG. 6 illustrates a flowchart of an exemplary process 600 for installing a high-speed loader 107 as part of an overall wafer carrier processing system 101 also comprising a wafer processing tool 103 and a wafer carrier transport system 105. With reference to FIG. 6, the process 600 begins with step 601. In step 602, the high-speed loader 107 (FIG. 1A) is aligned to the wafer processing tool 103 (FIG. 1C) and the wafer carrier transport system 105 (FIG. 1A) such that the high-speed wafer carrier handler 154 (FIG. 1B) of the high-speed loader 107 is properly positioned and oriented relative to the factory interface 123 of the wafer processing tool 103 and the wafer carrier transport system 105 prior to calibration of the high-speed loader 107. The step 602 of the process 600 may itself comprise a separate and distinct process. An exemplary embodiment of a process for performing step 602 is described below with reference to the flow charts of FIGS. 7A-9 and the apparatus of FIGS. 10A-13.

In step 603, the high-speed loader 107 (FIG. 1A) is calibrated to the wafer processing tool 103 (FIG. 1C) and the wafer carrier transport system 105 (FIG. 1A) so that the high-speed wafer carrier handler 154 (FIG. 1B) is rendered at least nominally operable within the overall wafer carrier processing system 101 (FIG. 1A) to exchange wafer carriers 109 (FIG. 1A) with the wafer carrier transport system 105 (FIG. 1A), with the docking stations 127 (FIG. 1B) and/or with the storage locations 135 (FIG. 1B). The step 603 of the process 600 may itself comprise a separate and distinct process. An exemplary embodiment of a process for performing step 603 is described below with reference to the flow charts of FIGS. 14-15 and the apparatus of FIGS. 16-18.

In step 604, the wafer carrier exchange functions of the high-speed loader 107 (FIG. 1A) with respect to the wafer carrier transport system 105 (FIG. 1A), the docking stations 127 (FIG. 1A) and the storage locations 135 (FIG. 1A) are tested. Preferably step 604 comprises at least operating the high-speed wafer carrier handler 154 (FIG. 1A) to remove wafer carrier 109 from and place a wafer carrier 109 on at least one wafer carrier support member 143 of the wafer carrier transport system 105, at least one docking station 127 of the factory interface 123, and at least one wafer carrier storage location 135. More and/or other functional tests may be performed. If the high-speed wafer carrier handler 154 performs these functions properly, the high-speed loader 107 may be ready for placement into regular service as a component of the wafer carrier processing system 101.

In step 605, the high-speed loader 107 (FIG. 1A) is placed into service as a component of the wafer carrier processing system 101 (FIG. 1A). In at least one embodiment, step 605 at least comprises providing an appropriate indication to the overall controller of the wafer carrier processing system 101 (e.g., the controller 178 or some other controller) such that the overall controller then establishes direct control over the relevant function of the high-speed loader 107. Step 605 may also comprise, for example, advising the overall controller of the existence of any wafer carriers 109 (FIG. 1A) that occupy the docking stations 127 (FIG. 1A) or the storage locations 135 (FIG. 1A) at the time control over the high-speed loader 107 is turned over to the overall controller. Such information may include the identity of the wafers (not shown) contained within each particular wafer carrier 109 and the location of each of those wafer carriers 109.

In step 606, the process 600 concludes.

Overall HSL Alignment Process

Figure 7A:
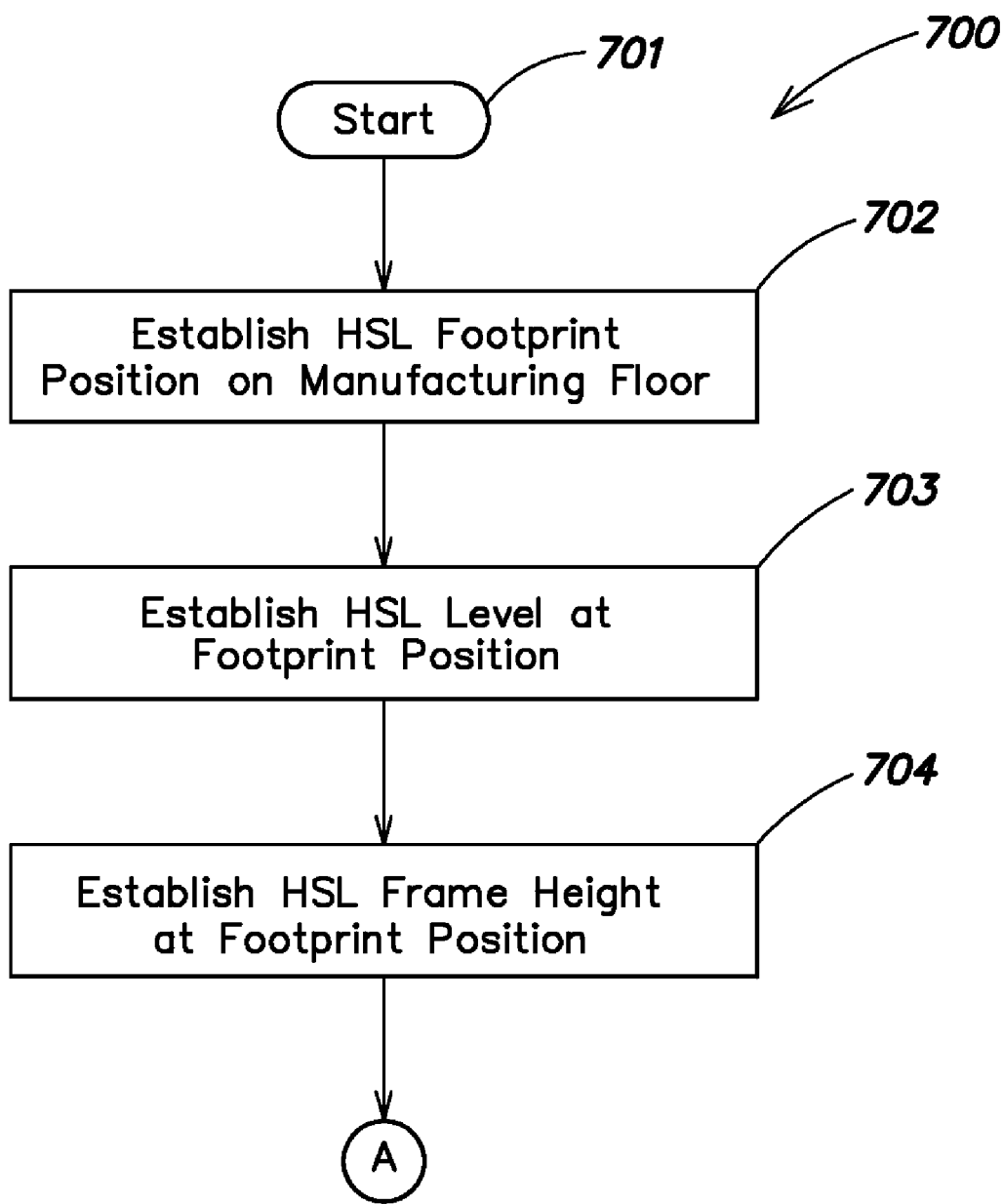
FIGS. 7A-7B illustrate a flowchart of an exemplary process for aligning a high-speed loader (FIG. 1A) to the factory interface of a wafer processing tool (FIG. 1C) and to a wafer carrier transport system (FIG. 1B) in accordance with an embodiment of the present invention.
Figure 7B:
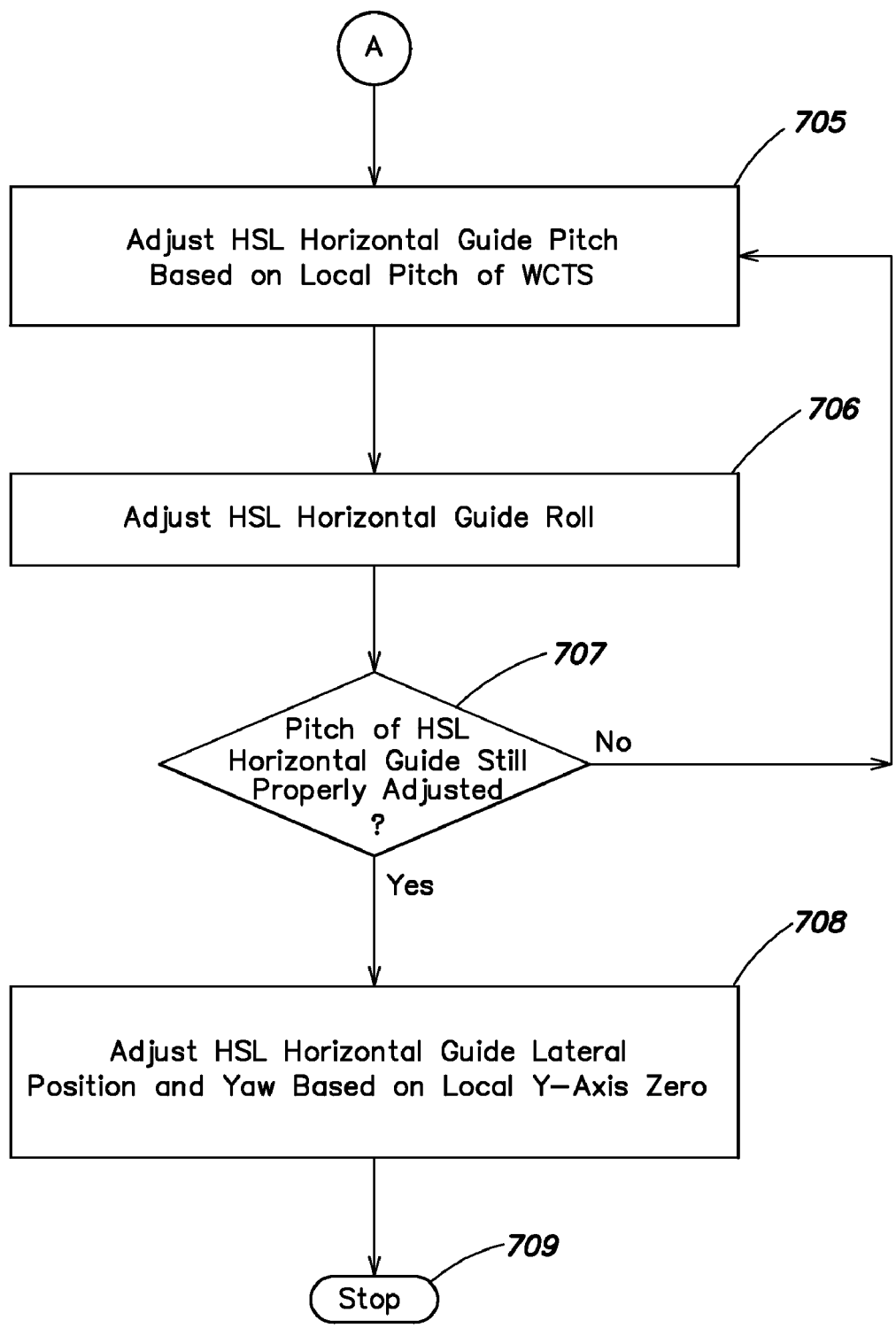

FIGS. 7A-7B illustrate a flowchart of an exemplary process 700 for aligning a high-speed loader 107 (FIG. 1A) to the factory interface 123 of a wafer processing tool 103 (FIG. 1C)

and to a wafer carrier transport system 105 (FIG. 1B). With reference to FIG. 7, the process 700 begins with step 701. In step 702, an approximate footprint position (not separately shown) for the high-speed loader 107 (FIG. 1A) is established.

The step 702 can comprise a separate process. However, an exemplary process is described below. First, a wafer processing tool 103 (FIG. 1C) is identified that is intended to be served by a wafer carrier transport system 105 (FIG. 1B). Preferably the wafer processing tool 103 is oriented and/or adjusted as necessary so that the datum plate 129 (FIG. 1C) of the factory interface 123 (FIG. 1C) of the wafer processing tool 103 is properly prepositioned. For example, the shelf support panel 133 (FIG. 1A) of the datum plate 129 can be aligned to the vertical and made parallel to the first path portion 111 (FIG. 1B) through which the wafer carrier transport system 105 is adapted to transport wafer carriers 109, such that a predetermined horizontal offset (not shown) separates the first path portion 111 and the shelf support panel 133. The latter are provisions intended to ensure that when the high-speed loader 107 (FIG. 1A) is installed adjacent to the wafer processing tool 103, the end effector 175 (FIG. 1B), the wafer carrier storage locations 135 (FIG. 1B), and the docking stations 127 of the factory interface 123 will be operable within, or will be finely adjustable to be operable within the same x-z plane.

Next, the step 702 preferably comprises installing the high-speed loader 107 (FIG. 1A) such that the feet 165 (FIG. 1B) of the elevation adjusting legs 161 (FIG. 1B) are firmly seated on the floor 115 (FIG. 1A) of the manufacturing facility, and are at approximately the same distance below the respective beams 159 from which the limbs 163 associated with each foot 165 project. Such a provision provides a useful starting point for adjustment of the posture of the frame 157 (FIG. 1A) of the high-speed loader 107 that at least nominally (if not actually) avoids twisting forces within the frame 157.

Next, the step 702 preferably comprises moving the frame 157 of the high-speed loader 107 (FIG. 1B) beneath the wafer carrier transport system 105 (FIG. 1B) and adjacent to the factory interface 123 of the wafer processing tool 103 (FIG. 1B) to a position on the floor 115 (FIG. 1C) of the manufacturing facility 113 that is roughly equivalent to where the high-speed loader 107 will fall after alignment to the wafer processing tool 103 and the wafer carrier transport system 105 is complete. One way of grossly or coarsely positioning the high-speed loader 107 is to place the frame 157 (FIG. 1A) of the high-speed loader 107 either directly against the factory interface 123 (FIG. 1A), or alternatively at a small distance from the factory interface 123, such that the docking stations 127 (FIG. 1A) of the factory interface 123 protrude into the envelope of the frame 157 and are roughly centered between adjacent sets of vertical beams 159 of the frame 157. The docking stations 127 may be prepositioned and pre-oriented relative to the datum plate 129 (FIG. 1A) such that they are level with the horizontal and extend substantially perpendicularly relative to the datum surface 131 of the datum plate 129. Similarly, the storage locations 135 (FIG. 1B), which also must protrude into the envelope of the frame 157 of the high-speed loader 107, may be positioned on the shelf support panel 133 (FIG. 1A) such that they are level with the horizon and extend substantially perpendicularly relative to the datum surface 131 of the datum plate 129. This assumes the storage locations are mounted on the datum plate 129. Note that the storage locations may alternatively be mounted on the frame 157 of the high speed loader 107, in which case they may be positioned as a unit.

As will be discussed more fully below, the datum plate 129 (FIG. 1A) and/or the shelf support panel 133 (FIG. 1A) may be horizontally adjustable along the y-axis relative to both the wafer carrier transport system 105 (FIG. 1A) and the high-speed loader 107 (FIG. 1A) after final alignment to ensure that the docking stations 127 (FIG. 1B) and the storage locations 135 (FIG. 1A) occupy the same x-z plane as the end effector 175 (FIG. 1A) of the high-speed wafer carrier handler 154 (FIG. 1A).

More importantly for present purposes, however, is the selection of an appropriate x-axis position for the high-speed loader 107 (FIG. 1B) relative to the factory interface 123 (FIG. 1B). As was referred to above, the x-axis position which centers the docking stations 127 within the frame 157 (FIG. 1B) of the high-speed loader 107 may generally be the best x-axis position for the high-speed loader 107. Nevertheless, a range of permissible positions may exist, given the fact that the high-speed wafer carrier handler 154 (FIG. 1A) of the high-speed loader 107 is adapted to be flexibly employed by the wafer carrier processing system 101 (FIG. 1B) to accomplish high-precision hand-offs at essentially any x-axis position along the range of motion of the end effector 175 (FIG. 1A) along the horizontal guide 169 (FIG. 1A) of the high-speed wafer carrier handler 154. As such, the foregoing docking station-centering alignment may be accomplished by human eye for the sake of speed and simplicity (although more precise placement techniques may be used).

The step 702 further comprises confirming that the high-speed loader 107 (FIG. 1C) is reasonably accurately situated in the x-y plane (e.g., position and/or rotation) relative to the wafer carrier transport system 105 (FIG. 1C). For example, the location of the frame 157 (FIG. 1C) of the high-speed loader 107 on the floor 115 (FIG. 1C) of the manufacturing facility 113 (FIG. 1B) may be visually checked to ensure that the path of the end effector 175 (FIG. 1C) of the high-speed wafer carrier handler 154 (FIG. 1C) along the horizontal guide 169 (FIG. 1C) of the high-speed wafer carrier handler 154 is aligned beneath the first path portion 111 (FIG. 1C) through which the wafer carrier transport system 105 (FIG. 1C) is adapted to transport wafer carriers 109. If by visual inspection this path-to-path horizontal alignment proves to be absent, the frame 157 (FIG. 1A) of the high-speed loader 107 may be moved and/or rotated within the x-y plane (e.g., the positions on the floor 115 of the manufacturing facility at which the feet 165 of the legs 161 of the frame 157 are seated may be changed) until the same visual inspection yields a positive result.

It should be noted that although it is preferred that the first path portion 111 be relatively long compared to the high-speed loader 107, the methods and apparatus of the present invention are equally applicable when the first path portion 111 comprises an x-axis length (not specifically shown) that is less than an x-axis length (not specifically shown) of the high-speed loader 107, and/or less than an x-axis length (not separately shown) of a range of horizontal motion of the end effector 175 along the horizontal guide 169.

At the conclusion of the step 702 the footprint (not separately shown) of the high-speed loader 107 should be located at a position on the floor 115 of the manufacturing facility 113 which approximates, to a fairly high degree of accuracy (e.g., such as may be reasonably achieved via use of the human eye), the position the footprint of the high-speed loader 107 will eventually occupy at the end of the process 700. It will be understood, however, that the process 700 provides also for fine-tuning of the position and orientation of the high-speed loader 107 as described below.

In step 703, a high precision level or similar device may be (directly) applied to each of the vertical guides 171 of the high-speed wafer carrier handler 154, and the legs 161 of the frame 157 of the high-speed loader 107 are adjusted so as to provide that both vertical guides 171, are simultaneously aligned with the vertical. Although, as will be described later, the orientation of the vertical guides 171 may diverge, preferably slightly from vertical in the final aligned state of the high-speed loader 107, nevertheless in at least one embodiment of the process 700, the vertical guides 171 are inspected such that they are aligned with each other. Such a provision tends to ensure against the possibility that unintended and avoidable x-axis twist will arise in the horizontal guide 169 of the high-speed wafer carrier handler 154 later in the process 700.

If significant adjustment of the posture of the frame 157 is necessary to achieve simultaneous verticality in the vertical guides 171, periodically lifting an end of the frame 157 slightly to allow the legs 161 at that end to shift position in the x-y plane on the floor 115 of the manufacturing facility 113 may avoid the buildup of undue stress within the frame 157.

Optionally, step 703 may additionally comprise applying a high-precision level or similar device to the end effector 175 of the high-speed wafer carrier handler 154 to verify that, after the vertical guides 171 have been aligned with the vertical, the end effector 175 exhibits a corresponding degree of alignment with the horizontal.

In step 704, the frame 185 (FIG. 3) of the launch sensor assembly 183 (FIG. 3) is set in its upright position as shown in FIG. 3 and the frame 157 (FIG. 1A) is adjusted to assume an acceptable elevation relative to the wafer carrier transport system 105. As the band 139 (FIG. 3) moves in the +x direction (e.g., into the paper), detectable features 153 move past the x-axis position of the launch sensor 184 of the launch sensor assembly 183. The overall elevation of the frame 157 relative to the wafer carrier transport system 105 should be adjusted, preferably via the adjustment of all of the legs 161 of the frame 157 in substantially equal measure, so that the beam of light 191 of the launch sensor assembly 183 reaches an elevation relative to the wafer carrier transport system 105 that is suitable for detection of the detectable features 153 as they move past the launch sensor assembly 183. If a range of acceptable elevations exists, it may be preferable to set the elevation of beam of light 191 at or near the mid-point of that range, to ensure against the elevation of the beam of light 191 falling out of that range by the end of the process 700, e.g., because of intervening process steps which may call for additional adjustment of the positions or the height of the legs 161 of the frame 157.

In step 705, the pitch (e.g., departure from alignment with the horizontal as viewed along the y-axis) of the horizontal guide 169 (FIG. 1B) of the high-speed wafer carrier handler 154 (FIG. 1A) may be adjusted so as to substantially match a pitch of the first path portion 111 (FIG. 1B) through which the wafer carrier transport system 105 is adapted to transport wafer carriers 109. The step 705 may itself comprise a separate and distinct process. An exemplary embodiment of a process for performing step 705 is described below with primary reference to the flow chart of FIG. 8, and the apparatus of FIGS. 1A-10B and 11.

In step 706, the roll (e.g., departure from alignment with the horizontal as viewed along the x-axis) of the horizontal guide 169 (FIG. 1B) of the high-speed wafer carrier handler 154 (FIG. 1B) is adjusted so as to substantially eliminate roll about the x-axis. It should be noted that the step 706 is not necessarily concerned with the type of x-axis twist which might cause the end effector 175 to execute what is known in aviation as a "barrel roll" as it moves along the horizontal guide 169. Rather, the step 706 is concerned with ensuring that, although the horizontal guide 169 may be permitted to exhibit a non-negligible degree of pitch as viewed along the y-axis, the horizontal guide 169 nevertheless exhibits a horizontally-aligned or level aspect as viewed along the x-axis.

To the extent that the horizontal guide 169 of the high-speed wafer carrier handler 154 guides the end effector 175 through a pitched path, it is apparent from the foregoing that there will preferably exist a non-tilted orientation for the horizontal guide 169 wherein it may, at the same time as it guides the end effector 175 upward, maintain a level or zero-roll condition in the end effector 175 throughout the climb. This is a goal of the step 705 and the step 706 of the process 700.

Proceeding with the description of the step 706, if the horizontal guide 169 is in a non-zero roll condition the posture of the frame 157 preferably is adjusted so that the horizontal guide 169 is reoriented to assume a non-zero roll condition. For this purpose a high-precision level or similar device may be placed on the end effector 175 to reveal whether the end effector 175 is at least horizontally-oriented along the +x direction (e.g., zero roll). Preferably the end effector 175 is moved along the horizontal guide 169 to determine if a non-zero roll angle exists. If a non-zero roll angle or offset exists, the posture of the frame 157 may be adjusted, for example, via adjusting the elevation of the frame 157 downward on one side of the band 139 of the wafer carrier transport system 105 by a certain extent, and/or adjusting the elevation of the frame 157 upward on the other side of the band 139 by the same or a similar extent, then rechecking for zero roll. Multiple such adjustments should be undertaken if needed until zero roll is achieved.

In step 707, the pitch of the horizontal guide 169 of the high-speed wafer carrier handler 154 is checked against the possibility that the roll adjustments undertaken in the step 706 resulted in the pitch of the horizontal guide 169, which was matched with that of the first path portion 111 after the step 705, is now no longer so matched due to the roll adjustments of the step 706. If indeed the pitch of the horizontal guide 169 no longer matches the pitch of the first path portion 111, the step 705 is repeated, and the step 706 is also repeated, followed by a recheck of the pitch of the horizontal guide 169. This cycle may repeat until the pitch of the horizontal guide 169 matches that of the first path portion 111 simultaneous with the roll of the horizontal guide 169 being substantially zero, at which time the high-speed loader 107 will be prepared for step 708.

In step 708, the y-axis position of the horizontal guide 169 (FIG. 1C) of the high-speed wafer carrier handler 154 (FIG. 1C) relative to the wafer carrier transport system 105 (FIG. 1C) is adjusted to eliminate any lateral displacement from a position beneath the wafer carrier transport system 105; and the orientation of the horizontal guide 169 is adjusted to eliminate any angular offset in the path through which the horizontal guide 169 guides the end effector 175 that comprises non-zero yaw (e.g., departure from vertical alignment with a vertically oriented plane containing the first path portion 111). For the purposes of the step 708, it should be noted that numerous options exist in the manner in which the y-axis position and the orientation of the horizontal guide 169 are adjusted in order to satisfy the step 708. For example, one option includes moving the frame 157 relative to the floor 115 of the manufacturing facility 113. Another option includes moving the horizontal guide 169 relative to the vertical guides 171 and therefore also relative to the frame 157 of the high-speed loader 107.

The step 708 may comprise a separate and distinct process. An exemplary embodiment of a process for performing the step 708 is described below with primary reference to FIG. 9, which illustrates a flowchart, and FIGS. 12A-B and 13, which illustrate apparatus. Once the step 708 is complete, the high-speed loader 107 is fully aligned with the wafer processing tool 103 and the wafer carrier transport system 105, and is prepared for calibration to the same.

In step 709 the process 700 concludes.

HSL Pitch Adjustment

Figure 8:
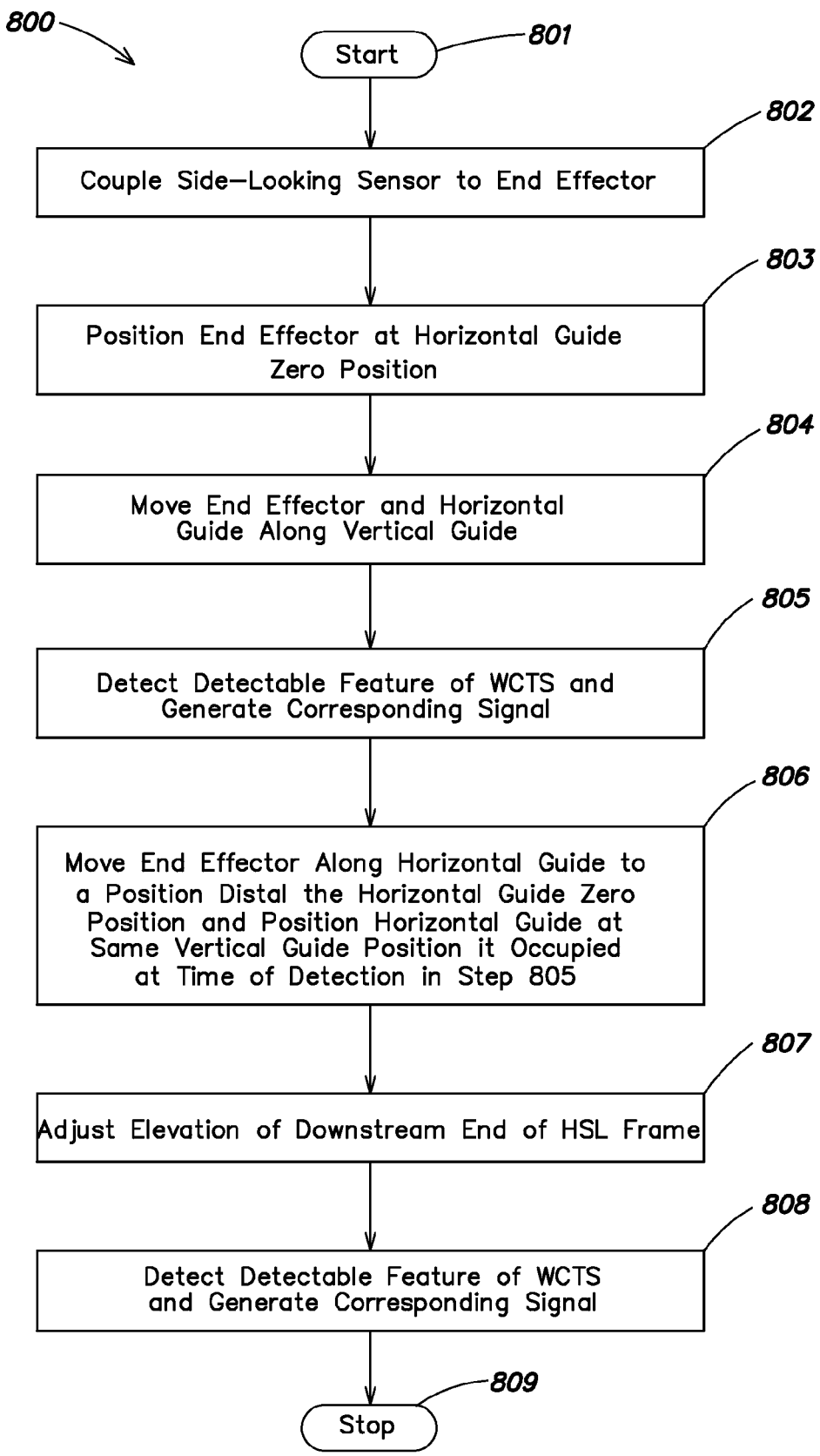
FIG. 8 illustrates a flowchart of an exemplary process for adjusting the orientation of a horizontal guide (FIG. 1A) of a high-speed wafer carrier handler so that the horizontal guide exhibits pitch that matches the pitch of a wafer carrier transport system in accordance with an embodiment of the present invention.
Figure 10A:
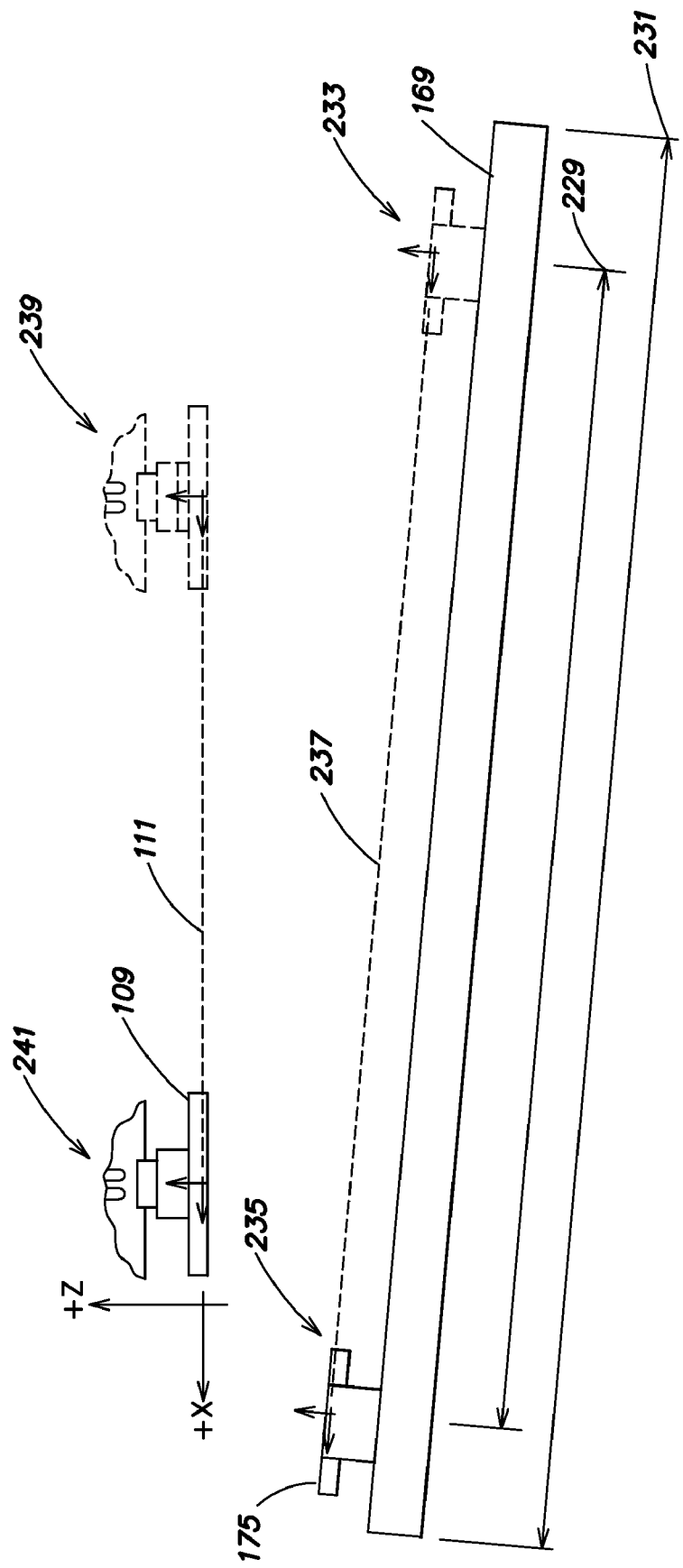
FIG. 10A is a schematic front view of the horizontal guide and the end effector of FIGS. 1A-1C.
Figure 10B:
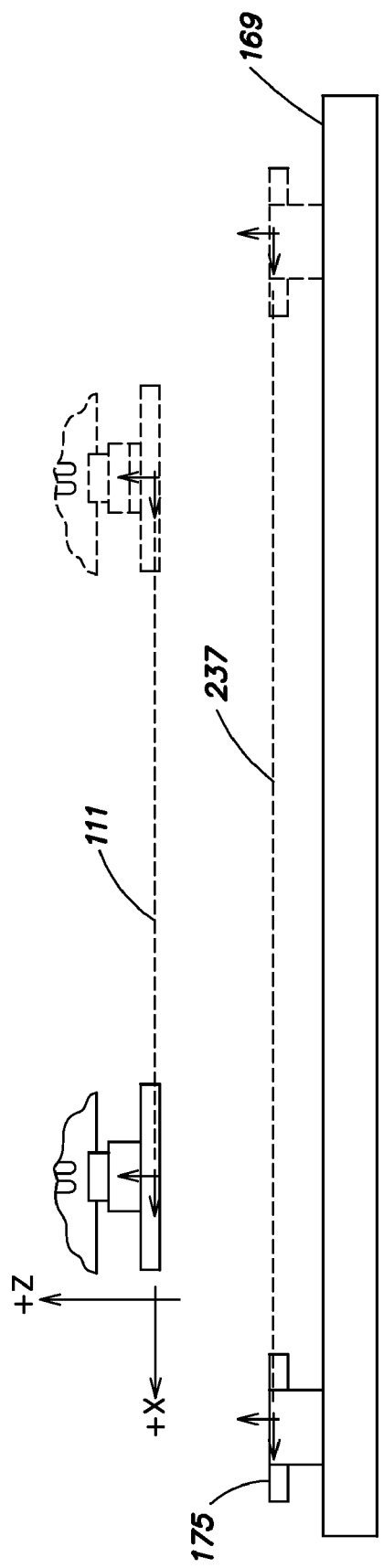
FIG. 10B is a schematic front view that is similar to FIG. 10A, except that in the view of FIG. 10B the pitch of a first path portion of a wafer carrier transport system and the pitch of a horizontal guide match.
Figure 11:
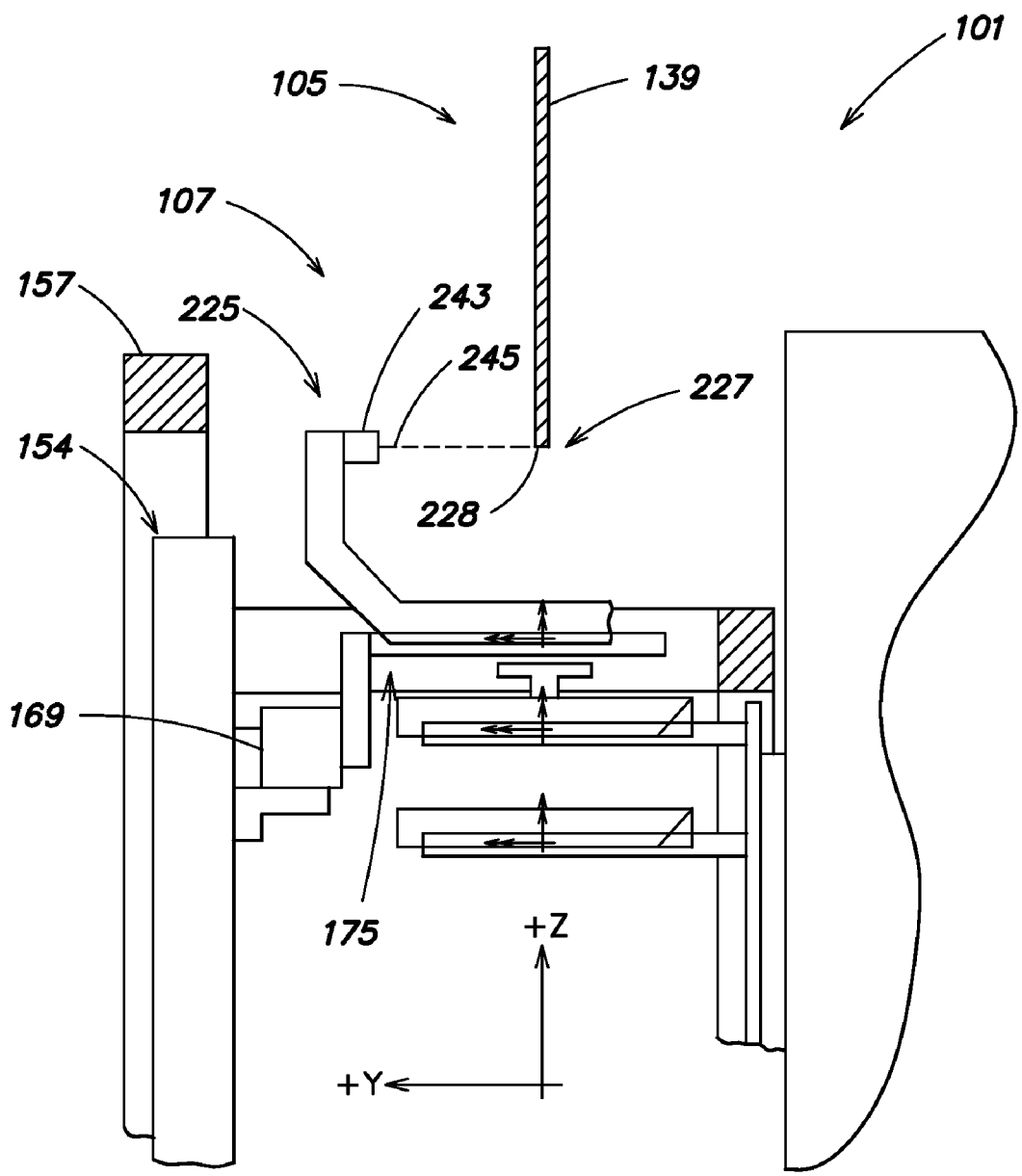
FIG. 11 is a schematic side view of the high-speed loader of FIGS. 1A-1C wherein a side-looking sensor is adapted to detect a detectable feature of and/or associated with a wafer carrier transport system.

FIG. 8 illustrates a flowchart of an exemplary process 800 for adjusting the orientation of the horizontal guide 169 (FIG. 1A) of the high-speed wafer carrier handler 154 so that the horizontal guide 169 exhibits pitch that matches the pitch of the first path portion 111 through which the wafer carrier transport system 105 is adapted to transport wafer carriers 109. FIGS. 10A-10B and FIG. 11 illustrate apparatus relevant to the process 800.

FIG. 10A is a schematic front view of the horizontal guide 169 and the end effector 175 of FIGS. 1A-1C, and of the first path portion 111 through which the wafer carrier transport system 105 (FIG. 1A) is adapted to transport wafer carriers 109, wherein the pitch of the first path portion 111 and the pitch of the horizontal guide 169 do not match. FIG. 10B is a schematic front view of the horizontal guide 169, the end effector 175, and the first path portion 111 that is similar to that of FIG. 1A, except that in the view of FIG. 10B the pitch of the first path portion 111 and the pitch of the horizontal guide 169 match. FIG. 11 is a schematic side view of the high-speed loader 107 of FIGS. 1A-1C, wherein a side-looking sensor, preferably mounted to the end effector 175 of the high-speed wafer carrier handler 154 is adapted to detect a detectable feature of and/or associated with the wafer carrier transport system 105 when the end effector 175 is positioned at a predefinable elevation relative to the wafer carrier transport system 105.

With reference to FIGS. 8, 10A-10B and 11, the process 800 begins with step 801. In step 802, a side-looking sensor assembly 225 is mounted to the end effector 175 of the high-speed wafer carrier handler 154, as shown in FIG. 11. The sensor assembly 225 is adapted to detect a detectable feature 227 of and/or associated with the wafer carrier transport system 105 which, in the embodiment of FIG. 11, comprises a bottom edge 228 of the band 139 of the wafer carrier transport system 105.

In step 803, the end effector 175 is positioned at a predefined zero point along the length of the horizontal guide 169 referred to hereafter as the "horizontal zero" of the high-speed wafer carrier handler 154. In one embodiment, the horizontal zero is a point along the range of motion of the end effector 175 along the horizontal guide 169 that is substantially close to the upstream-most point along that range (reference numeral 233 in FIG. 10A). Such a position may maximize the useable "runway" length of the horizontal guide 169 so that the horizontal guide 169 can support increasingly higher wafer carrier exchange velocities.

In step 804 the end effector 175, which is held motionless by the horizontal guide 169 at the position 233 or horizontal zero, and the horizontal guide 169 are moved together (i.e., as a unit) vertically up or down along each of the vertical guides 171 (FIG. 11) in equal measure.

In step 805, a side-looking sensor 243 (FIG. 11) of the sensor assembly 225 (FIG. 11), which is adapted to detect the detectable feature 227 when the detectable feature 227 is aligned with the sensor 243, detects the detectable feature 227. For example, the sensor 243 of the sensor assembly 225 may generate a signal in response to said detection (e.g., and provide the signal to the controller 178 (FIG. 1B)).

In step 806 the end effector 175 is moved from the position it occupied along the length of the horizontal guide 169 during steps 804 and 805, which preferably comprised the position 233 or horizontal zero, to a different position along the length of the horizontal guide 169 (e.g., downstream of the position 233). For example, the end effector 175 may be moved to a point 235 near the end of the range of travel of the end effector 175 opposite the end associated with the position 233 or horizontal zero. (In step 806, the horizontal guide 169 preferably is positioned at the same vertical guide position it occupied at the instant of detection of the detectable feature 227 during step 805.)

In step 807, the end effector 175 is again held motionless by the horizontal guide 169, this time at the downstream position 235 as shown in FIGS. 10A-10B. If needed, the posture of the frame 157 of the high-speed loader 107 is then adjusted (e.g., by adjusting the length of legs 161 (FIG. 1B) sufficiently to cause the sensor 243, now moved, to again detect the detectable feature 227.

In step 808, the sensor 243, as it did in step 805, again detects the detectable feature 227 and generates a signal indicating said detection, and the posture adjustment of the frame 157 is stopped coincident with said detection. For example, the sensor 243 may provide the generated signal to the controller 178 (FIG. 1B).

Those possessing skill in the art will recognize other methods of causing the downstream detection to occur and thus to complete the process 800. For example, shims may be introduced beneath the downstream end of the frame 157. Alternatively, the orientation of the vertical guides 171 may be adjusted as a unit relative to the frame 157 of the high-speed loader 107.

The side-looking sensor employed in the process 800 need not be used to observe a detectable feature that is formed by or part of the band 139 of the wafer carrier transport system 105 as illustrated in FIG. 10. A detectable feature of a wafer carrier support member 143 of the wafer carrier transport system 105 may be utilized. So may a detectable feature of a wafer carrier 109 or a detectable feature of the wafer carrier transport system 105 that does not move with the band 139, e.g., an extension of a support frame (not shown) that extends downward. It is preferred that, as with the axis 245 of the sensor 243, the side-looking sensor employed in the process 800 is aligned with the horizontal guide 169 so that when the end effector 175 is set at zero roll the alignment of the side-looking sensor is substantially level to the horizon. Any suitable sensor type may be used (e.g., reflective, through beam, etc.)

HSL YAW and Y-Axis Displacement Adjustment

Figure 9:
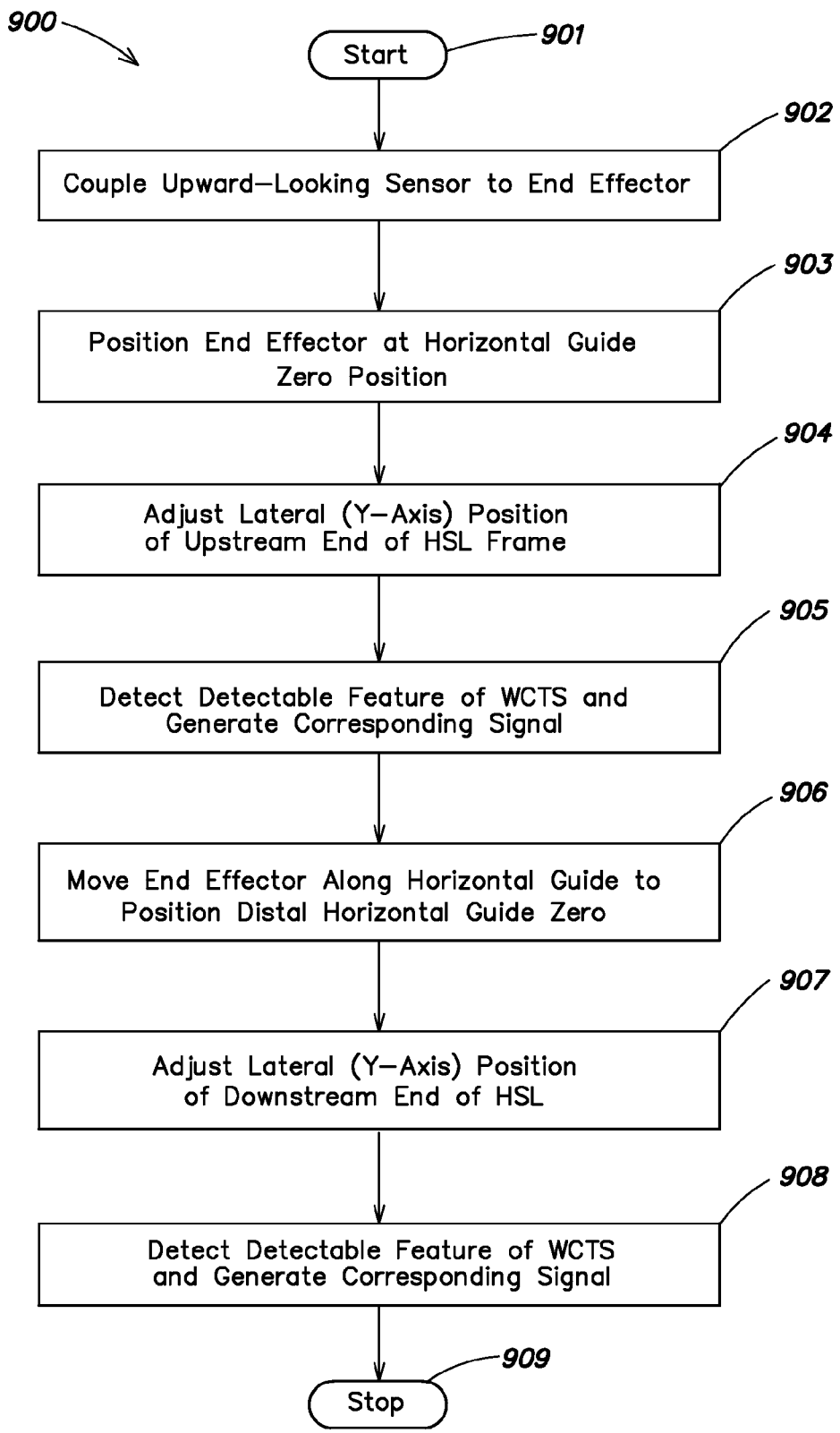
FIG. 9 illustrates a flowchart of an exemplary process for adjusting the y-axis position and yaw orientation of a horizontal guide (FIG. 1C) of a high-speed wafer carrier handler of a high-speed loader in accordance with an embodiment of the present invention.

FIG. 9 illustrates a flowchart of an exemplary process 900 for adjusting the y-axis position and yaw orientation of the horizontal guide 169 (FIG. 1C) of the high-speed wafer carrier handler 154 (FIG. 1C) of the high-speed loader 107 (FIG. 1C) so that the horizontal guide 169 is aligned beneath the wafer carrier transport system 105 and the path 237 (FIG. 12) of the end effector 175 is aligned within a vertically-oriented plane containing the first path portion 111 (e.g., zero yaw offset). FIG. 13 illustrates apparatus relevant to the process 900.

FIG. 13 is a schematic side view of the high-speed loader 107 of FIGS. 1A-1C, wherein an upward-looking sensor, preferably mounted to the end effector 175 of the high-speed wafer carrier handler 154, is adapted to detect a detectable feature of or associated with the wafer carrier transport system 105 when the end effector 175 is properly aligned beneath the first path portion 111.

With reference to FIGS. 9 and 13, the process 900 begins with step 901. In step 902, an upward-looking sensor assembly 247 is mounted to the end effector 175 of the high-speed wafer carrier handler 154 as shown in FIG. 13. The assembly 247 is adapted to detect a detectable feature 249 of or associated with the wafer carrier transport system 105, which in the embodiment of FIG. 13 comprises a downward facing surface 251 of the band 139 of the wafer carrier transport system 105.

In step 903, the end effector 175 is positioned at the horizontal zero or position 233 (FIG. 12A) of the horizontal guide 169. In step 904, the y-axis position of the upstream end of the frame 157 (e.g., the end of the frame 157 at which the end effector 175 is positioned) is adjusted relative to the floor 115 of the manufacturing facility 113, and to the wafer carrier transport system 105.

In step 905, an upward looking sensor 253 of the assembly 247 (FIG. 13), which is adapted to detect the feature 249 when the feature 249 is aligned with the sensor 253, detects the feature 249. For example, the sensor 253 generates a signal in response to said detection, and in response thereto, the y-axis movement of the upstream end of the frame 157 is ceased (e.g., automatically or by an operator). For example, the controller 178 (FIG. 1B) may receive the generated signal and cause y-axis movement of the frame 157 to halt (e.g., by generating a warning to an operator, by halting a motor (not shown) that moves the frame 157, etc.).

Figure 12A:
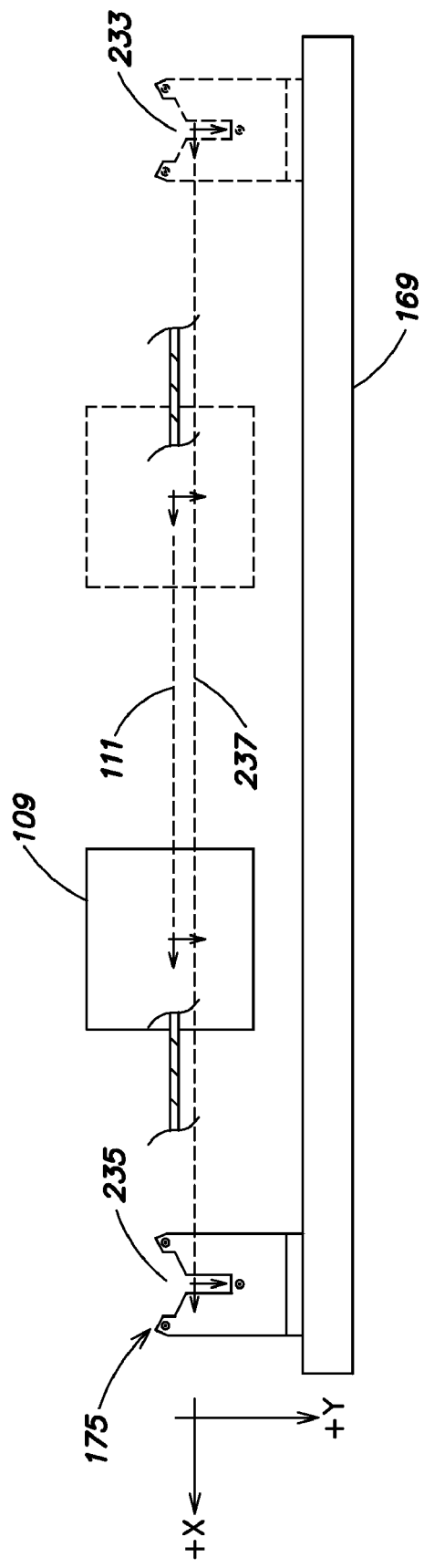
FIGS. 12A-12B illustrates a horizontal guide of an high-speed loader before and after, respectively, adjustment of a y-axis position and/or yaw of the horizontal guide relative to a wafer carrier transport system.
Figure 13:
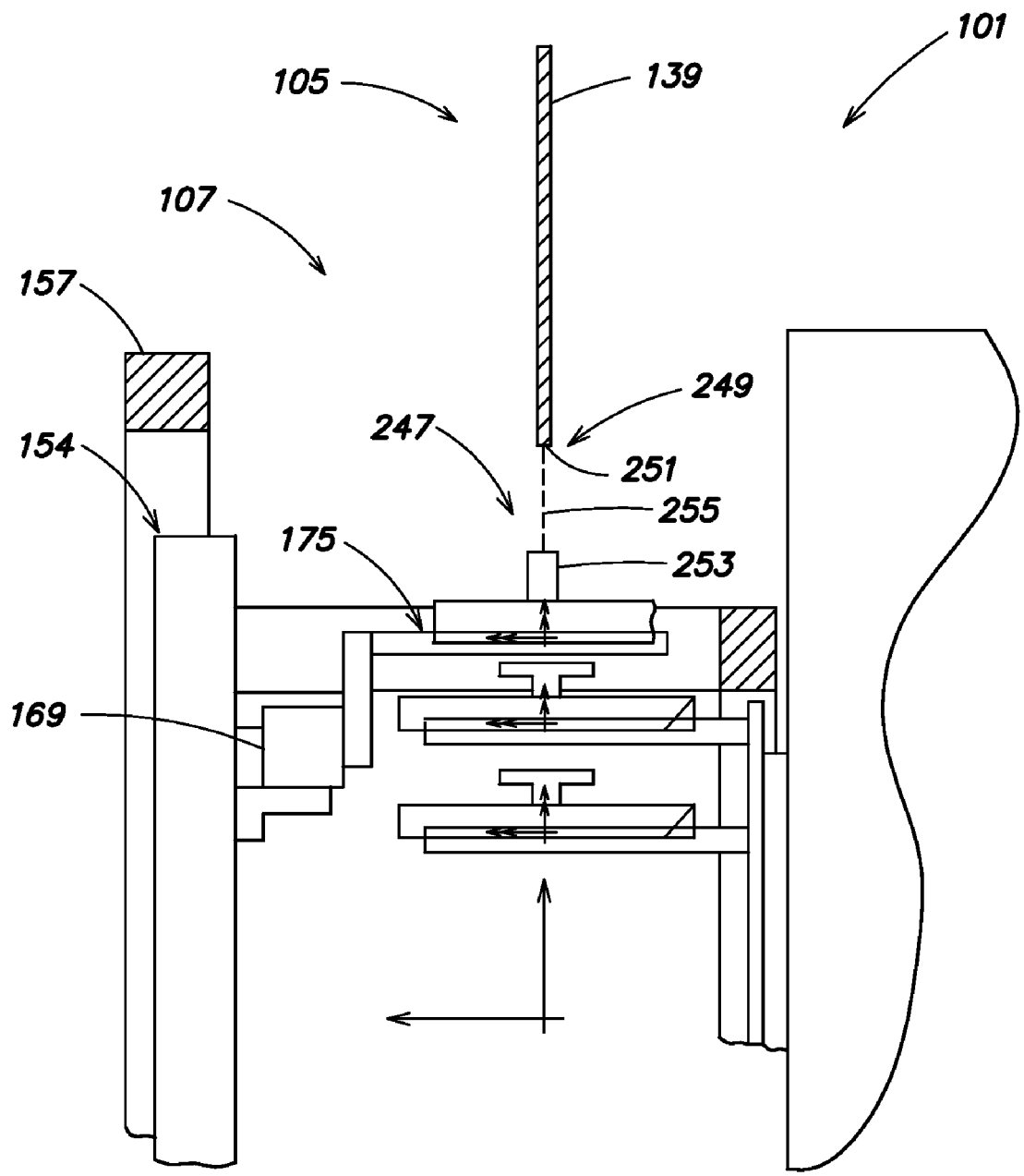
FIG. 13 is a schematic side view of the high-speed loader of FIGS. 1A-1C, wherein an upward-looking sensor is adapted to detect a detectable feature of or associated with a wafer carrier transport system.

In step 906, the end effector 175 is moved from the position 233 to the position 235 at the opposite end of the horizontal guide 169 (FIG. 12A).

Figure 12B:
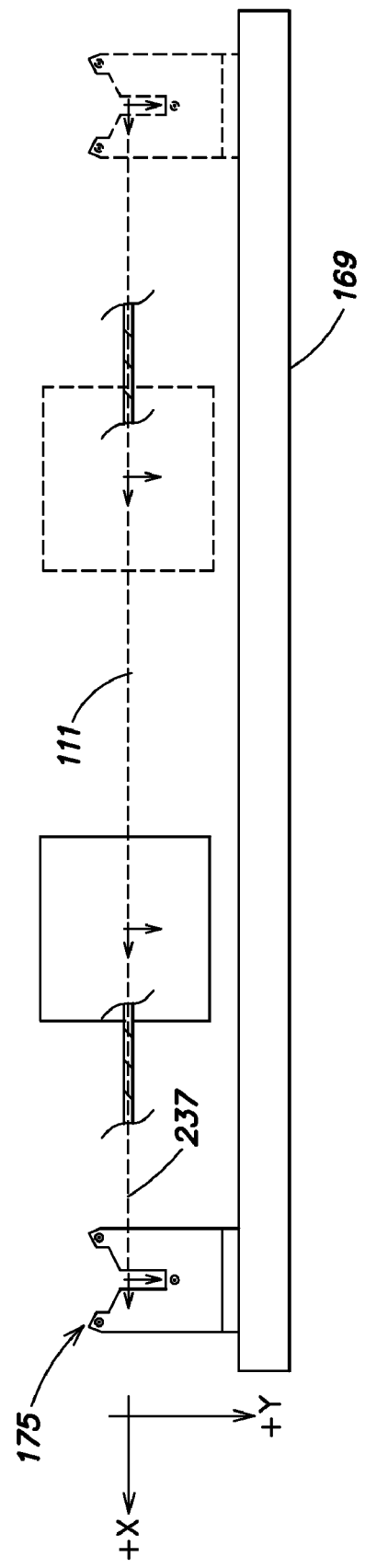

In step 907, the end effector 175 is again held motionless by the horizontal guide 169, this time at the downstream position 235 as shown in FIGS. 12A-12B. The y-axis position of the downstream end of the frame 157 (e.g., the end of the frame 157 at which the end effector 175 is now positioned) is adjusted relative to the floor 115 of the manufacturing facility 113, and to the wafer carrier transport system 105, sufficiently to cause the sensor 253, now moved, to again detect the feature 249.

In step 908, the sensor 253, as it did in the step 905, again detects the feature 249 and generates a signal indicating said detection (which may cause the y-axis movement of the downstream end of the frame 157 to cease, such as via the controller 178 as described above). The horizontal guide 169 is now properly aligned beneath the wafer carrier transport system 105 such that the path 237 is aligned with a vertically-oriented plane containing the first path portion 111, and the high-speed loader 107 is ready for calibration to the wafer processing tool 103 and to the wafer carrier transport system 105.

In step 909, the process 900 concludes.

The upward-looking sensor employed in the process 900 need not be used to observe a detectable feature that is formed by part of the band 139 of the wafer carrier transport system 105 as illustrated in FIG. 13. For example, a detectable feature of a wafer carrier 109 may be utilized, as may a detectable feature of the wafer carrier transport system 105 that does not move with the band 139, e.g., an extension of a support frame (not shown) that extends downward. In addition, sensors facing both upward and to the side may be utilized for the purposes of the process 900. Any suitable sensor type may be used (e.g., reflective, through beam, etc.)

Referring again to FIG. 4, the mounting shelf 173a permits y-axis motion of the horizontal guide 169 relative to the vertical guide 171 and thereby also relative to the frame 157 (as described previously). Rather than undertake to adjust the position of the frame 157 relative to the floor 115 of the manufacturing facility 113 as the sole means to achieve the alignment of the horizontal guide 169 beneath the wafer carrier transport system 105 and of the path 237 within a vertically-oriented plane containing the first path portion 111, one may, when sufficiently close to final alignment, choose instead to finely adjust the position of the horizontal guide 169 relative to the vertical guide 171 to arrive at the desired degree of y-axis and yaw precision.

Establishing HSL End Effector Vertical Zero

Figure 14:
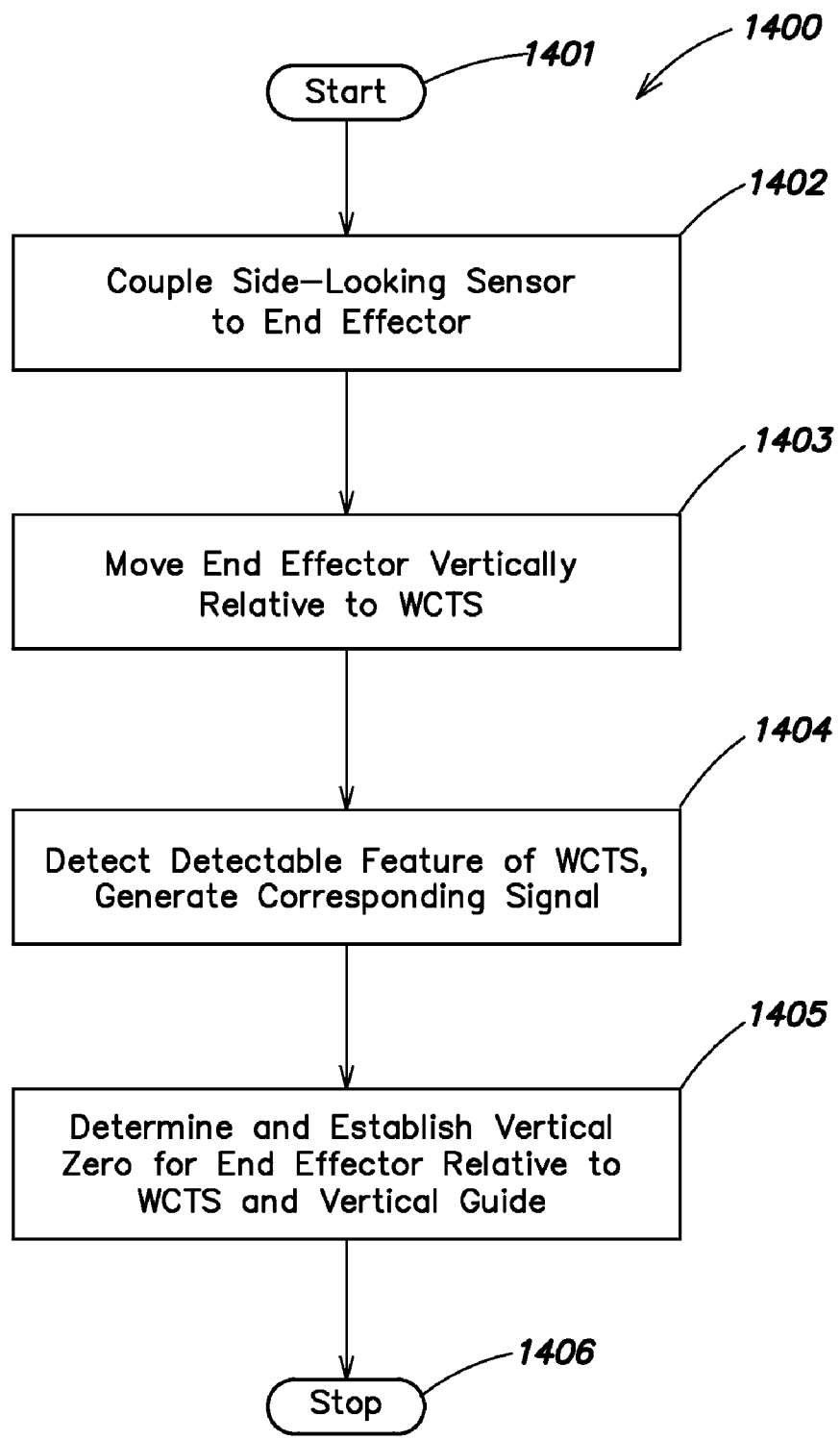
FIG. 14 illustrates a flow chart of an exemplary process for establishing an elevation of an end effector of a high-speed loader relative to a wafer carrier transport system as a "vertical zero" for the end effector in accordance with an embodiment of the present invention.

FIG. 14 illustrates a flow chart of an exemplary process 1400 for establishing an elevation of the end effector 175 of the high-speed loader 107 relative to the wafer carrier transport system 105 as a "vertical zero" for the end effector 175 at which the end effector 175 may be caused to dwell, e.g., during the time just prior to a wafer carrier exchange launch. At least two distinct elevations may be so established, one such elevation corresponding to a suitable elevation for the end effector 175 to dwell when awaiting an opportunity to place a wafer carrier 109 on the wafer carrier transport system 105, and another such elevation corresponding to a suitable elevation for the end effector 175 to dwell when awaiting the opportunity to remove a wafer carrier 109 from the wafer carrier transport system 105. The former elevation will generally be lower than the latter, since the wafer carrier 109 awaiting placement will need to be supported at a low enough elevation to preclude contact between that wafer carrier to be loaded onto the wafer carrier transport system 105 and the other wafer carriers 109 being transported overhead by the wafer carrier transport system 105. By contrast, the latter elevation may be higher since no wafer carrier 109 is being supported by the end effector 175 that requires such clearance. Nevertheless, the process 1400 may be utilized for establishing a vertical zero for either or both functions, and FIGS. 16-17 illustrate apparatus relevant to the process 1400.

Figure 16:
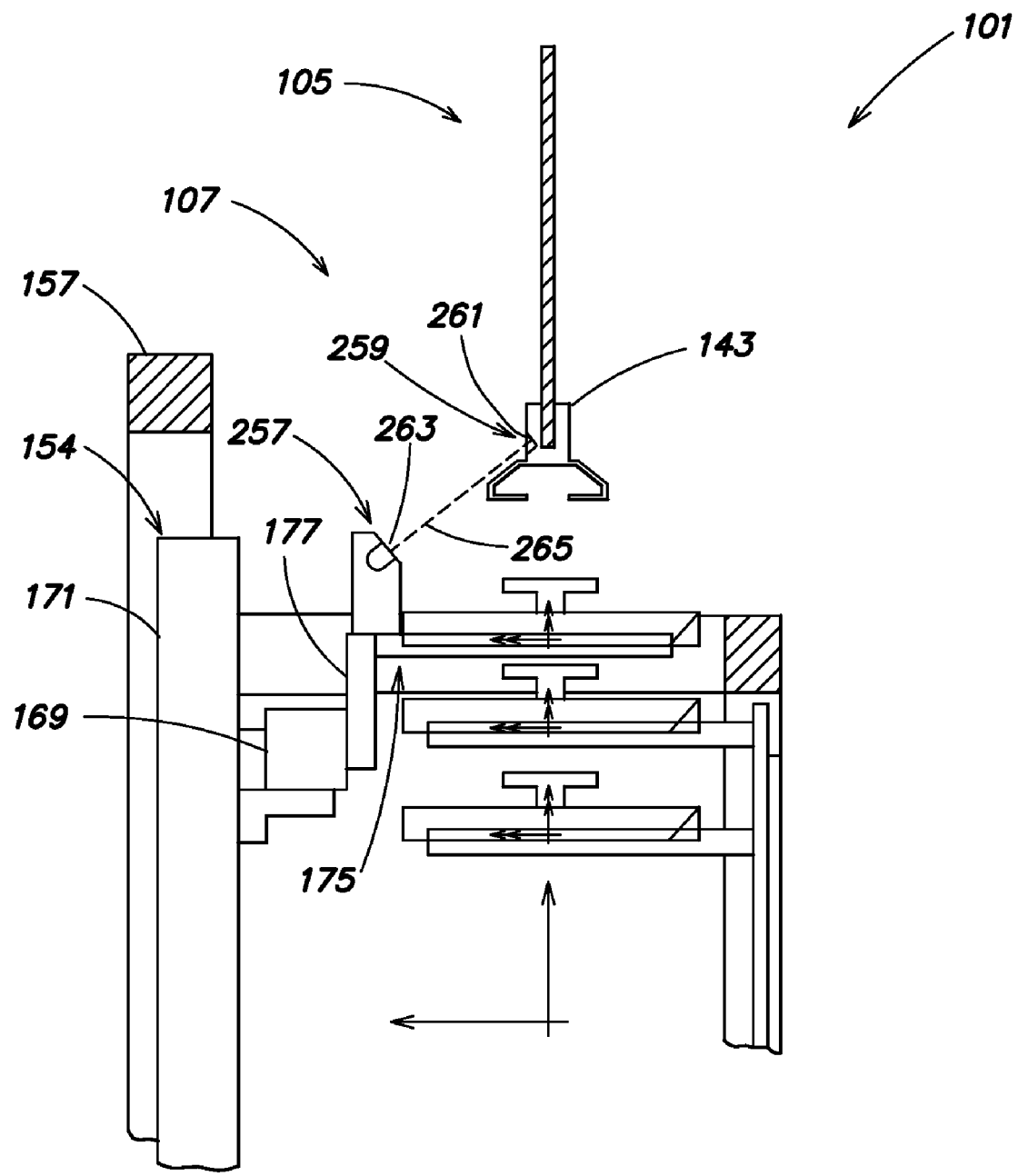
FIGS. 16 and 17 are schematic side views of the high-speed loader of FIGS. 1A-1C wherein a side-looking sensor is adapted to detect a detectable feature of and/or associated with a wafer carrier transport system.
Figure 17:
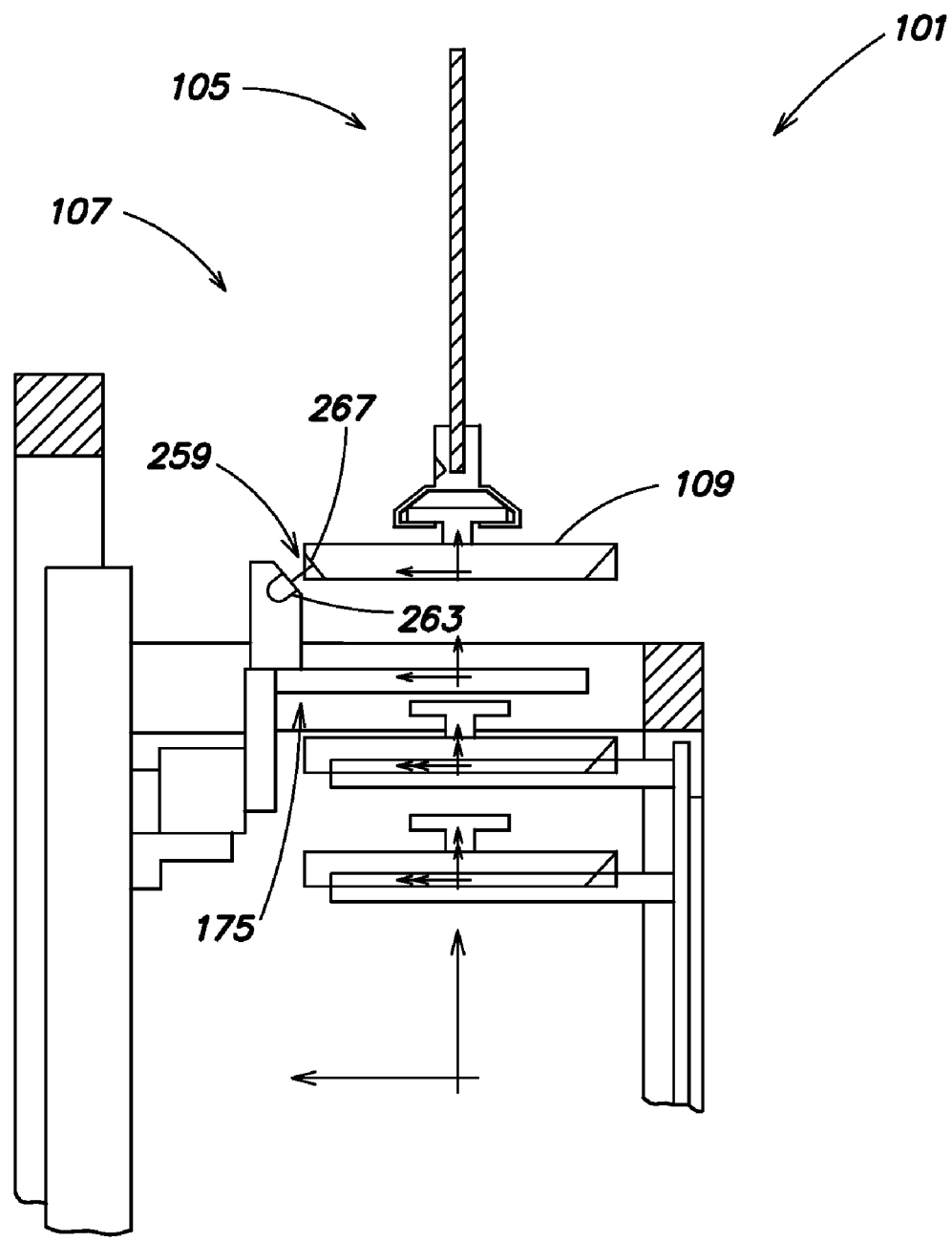

FIGS. 16 and 17 are schematic side views of the high-speed loader 107 of FIGS. 1A-1C, wherein a side-looking sensor, preferably mounted to the end effector 175 of the high-speed wafer carrier handler 154, is adapted to detect a detectable feature of and/or associated with the wafer carrier transport system 105 when the end effector 175 is at a predefinable elevation relative to the wafer carrier transport system 105.

With reference to FIGS. 14, 16 and 17, the process 1400 begins with step 1401. In step 1402, a side-looking sensor assembly 257 is mounted to the end effector 175 of the high-speed wafer carrier handler 154 as shown in FIG. 16. The sensor assembly 257 is adapted to detect a detectable feature 259 of and/or associated with the wafer carrier transport system 105, which in the exemplary embodiment of FIG. 16, comprises a surface 261 of the wafer carrier support member 143 of the wafer carrier transport system 105.

In step 1403, the end effector 175 and the horizontal guide 169 of the high-speed wafer carrier handler 154 are moved vertically relative to the vertical guides 171 and to the wafer carrier transport system 105.

In step 1404, a side-looking sensor 263 (FIG. 16) of the sensor assembly 257 (FIG. 16), which is adapted to detect the feature 259 when the feature 259 is aligned with an axis 265 defined by the sensor 263, detects the feature 259. Preferably the sensor 263 generates a signal in response to said detection. The controller 178 (FIG. 1B) may receive the generated signal.

In step 1405, the controller 178 of the wafer carrier processing system 101 (FIG. 16) determines, based on the signal from the sensor 263, the position along the vertical guides 171 occupied by the horizontal guide 169 when the sensor 263 detected the feature 259. The sensor assembly 257 is geometrically configured to cause the sensor 263 to detect the feature 259 when the end effector 175 is at an elevation relative to the wafer carrier transport system 105 that is suitable for establishment of the vertical zero of the end effector 175. The controller 178 preferably stores a value corresponding to the position of the horizontal guide 169 relative to the vertical guides 171 when detection takes place, such that whenever the end effector 175 must be positioned at its vertical zero, the controller 178 may determine the value and properly position the horizontal guide 169.

In step 1406, the process 1400 concludes.

Although it is preferred that the sensor assembly 257 be coupled to the end effector 175 for the purposes of the process 1400, it will be recognized by those possessing skill in the art that other coupling positions be selected. For example, the sensor assembly 257 may be coupled directly to the horizontal guide 169, or to the mounting plate 177. Note that the wafer carrier processing system 101 may be adapted to automatically "teach" itself the vertical zero elevation via the signal from the sensor 263 (and/or with the controller 178).

Referring to FIG. 17, the sensor 263 of the sensor assembly 257 may also be employed to detect a feature 259 that is part of a wafer carrier 109 transported by the wafer carrier transport system 105. The feature 259 of FIG. 17 comprises a surface 267 of the wafer carrier 109.

Note that based on the vertical zero determined for the horizontal guide 169 when a wafer carrier 109 is not present on the end effector 175 (process 1400), the vertical zero for the horizontal guide 169 when a wafer carrier is present on the end effector 175 can be easily determined (e.g., manually or automatically) if the thickness of the wafer carrier 109 is known.

Establishing HSL End Effector Horizontal Launch Offset

Figure 15:
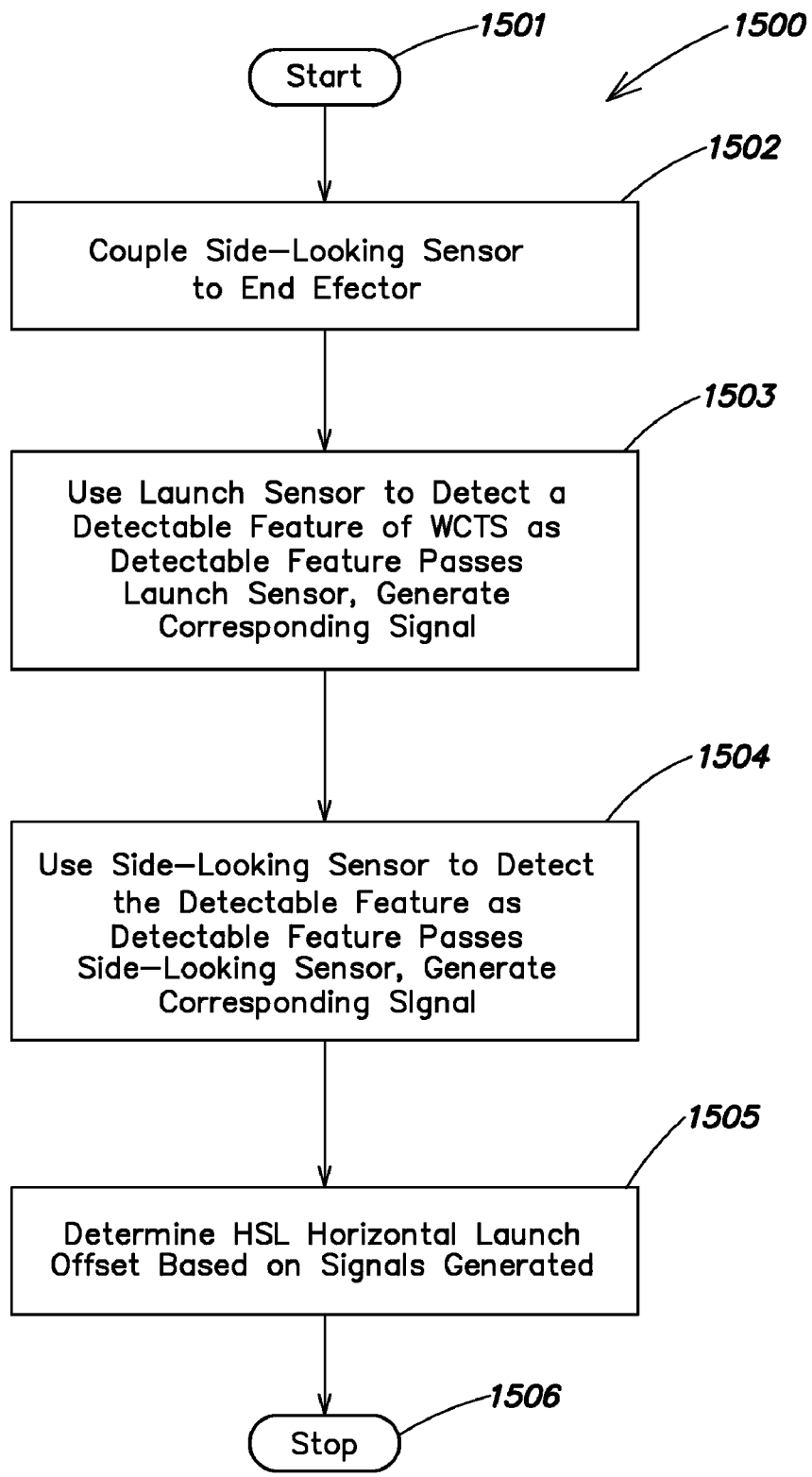
FIG. 15 illustrates a flow chart of an exemplary process for establishing a "horizontal launch offset" of an end effector of a high-speed loader relative to a launch sensor (FIG. 3) in accordance with an embodiment of the present invention.

FIG. 15 illustrates a flow chart of an exemplary process 1500 for establishing a "horizontal launch offset" of the end effector 175 of the high-speed loader 107 relative to the launch sensor 184 (FIG. 3). A knowledge of the horizontal launch offset allows the wafer carrier processing system 101 to properly time wafer carrier exchange launches of the end effector 175.

The horizontal launch offset of a high-speed loader 107 can comprise or otherwise be related to the span of time between the time a given point on the wafer carrier transport system 105 passes the launch sensor 184, and time that point of the wafer carrier transport system 105 passes the position 233 or horizontal zero of the end effector 175 (e.g., for a given speed of the wafer carrier transport system 105). The horizontal launch offset may alternatively comprise or be based on the actual distance along the x-axis between the launch sensor 184 and the position 233 or horizontal zero of the end effector 175.

With reference to FIGS. 3, 11 and 15, the process 1500 begins with step 1501. In step 1502, a side-looking sensor assembly, e.g., the sensor assembly 225 of FIG. 11, is mounted to the end effector 175 (FIG. 11). The sensor assembly 225 is adapted to detect a detectable feature 227 of and/or associated with the wafer carrier transport system 105. Preferably the sensor assembly 225 is adapted to detect the detectable features 153 (FIG. 3) comprising slots 179 cut into the band 139.

In step 1503, the launch sensor of the high-speed loader 107, e.g., the launch sensor 184 of FIG. 3, detects a detectable feature 153 of the wafer carrier transport system 105 as it passes the launch sensor 184, and generates a signal. The generated signal may be provided to the controller 178 (FIG. 1B). The step 1503 may be performed in accordance with the method described above with reference to FIG. 3.

In step 1504, the sensor 243 (FIG. 11) of the sensor assembly 225 detects the same detectable feature 153 detected during the step 1503 by the launch sensor 184, and generates a signal. The generated signal may be provided to the controller 178 (FIG. 1B). The step 1504 may be performed in accordance with the method described above with reference to FIG. 3.

In step 1505, a horizontal launch offset for the end effector 175 of the high-speed loader 107 is determined based on the signals of the step 1503 and the step 1504. For example, based on the time between the two signals, the distance between the sensors 184 and 243 and/or knowledge of the speed of the wafer carrier transport system 105, the horizontal launch offset may be easily determined (e.g., automatically via the controller 178).

In step 1506, the process 1500 concludes.

Although the process 1500 involved the detection of the same detectable feature 153 twice, exemplary embodiments of processes adapted to perform the same function as the process 1500 in accordance with the present invention include detecting two separate detectable features, either of which may or may not be a detectable feature 153. Other types of sensors may be employed as may other detectable features of a wafer carrier 109, reflective surfaces, etc.

Additional Details

Figure 18:
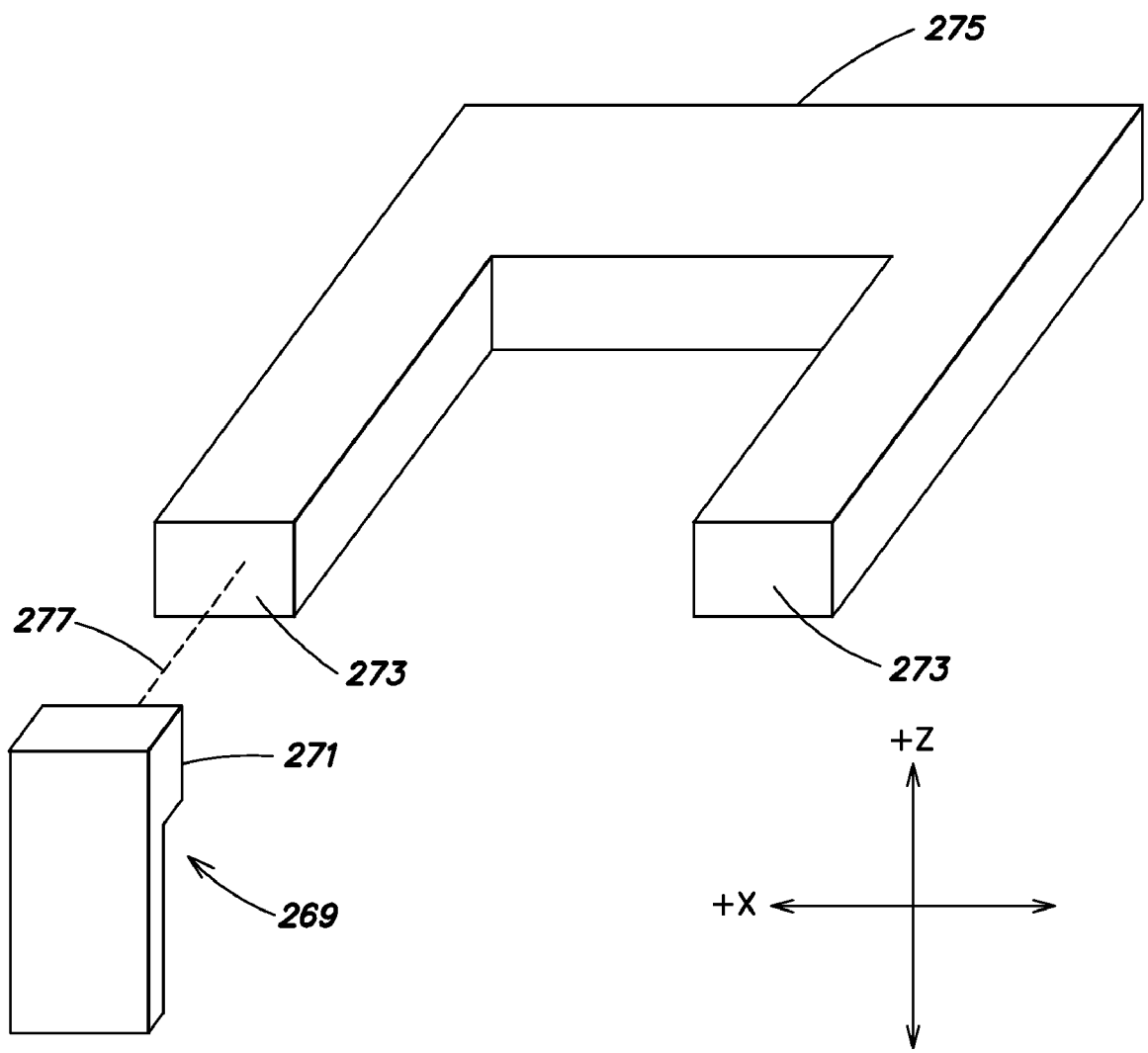
FIG. 18 is a perspective schematic view of a sensor assembly adapted to detect detectable features of a shelf or other storage location and generate signals for determining a position of the shelf and/or docking station in the x-z plane.

Referring back to FIG. 6 and the process 600 of the flow chart illustrated thereby, the step 603 preferably comprises calibrating the high-speed wafer carrier handler 154 of the high-speed loader 107 to each wafer carrier storage location 135 and docking station 127 of the factory interface 123 of the wafer processing tool 103. FIG. 18 is a perspective schematic view of a sensor assembly adapted to detect detectable features of a shelf or other storage location and generate signals for determining a position of the shelf and/or docking station in the x-z plane. In the embodiment shown, a sensor assembly 269 comprises a side-looking sensor 271 coupled to the end effector 175 (not shown) adapted to detect detectable features 273 of a shelf 275 (e.g., a reflective feature such as a flat region of the shelf/docking station). The sensor 271 is adapted to generate a signal in response to detecting a detectable feature 273 and such a signal may be provided to the controller 178 (FIG. 1B).

When caused to pass a detectable feature 273 in the z-axis direction so that the sensor 271 aligns with the detectable features 273, the sensor 271 is adapted to generate a signal, thus enabling a position of the shelf along the z-axis to be determined. When caused to pass a detectable feature 273 in the x-axis direction so that the axis 277 of the sensor 271 aligns with the detectable feature 273, the sensor 271 is adapted to generate a signal to enable a position of the shelf along the x-axis to be determined. The detectable features 273 alternatively (or additionally) can comprise a part of a docking station 127 for determination of an x-z position of the docking station by a sensor 271 coupled to the end effector 175. In this way, the x-z positions of each wafer carrier storage location 135 (FIG. 1A) and each docking station 127 (FIG. 1A) of the factory interface 123 may be determined by the wafer carrier processing system 101, and the calibration of the high-speed loader 107 to the wafer processing tool 103 will be complete. The thickness and/or width of each shelf and/or docking station may be determined based on when the sensor 271 first detects a detectable feature 273 relative to when the sensor 271 stops detecting the detectable feature 273 as the sensor 271 moves past the detectable feature 273.

Any suitable sensor configuration may be employed (e.g., reflection based, through beam, etc.)

Figure 19:
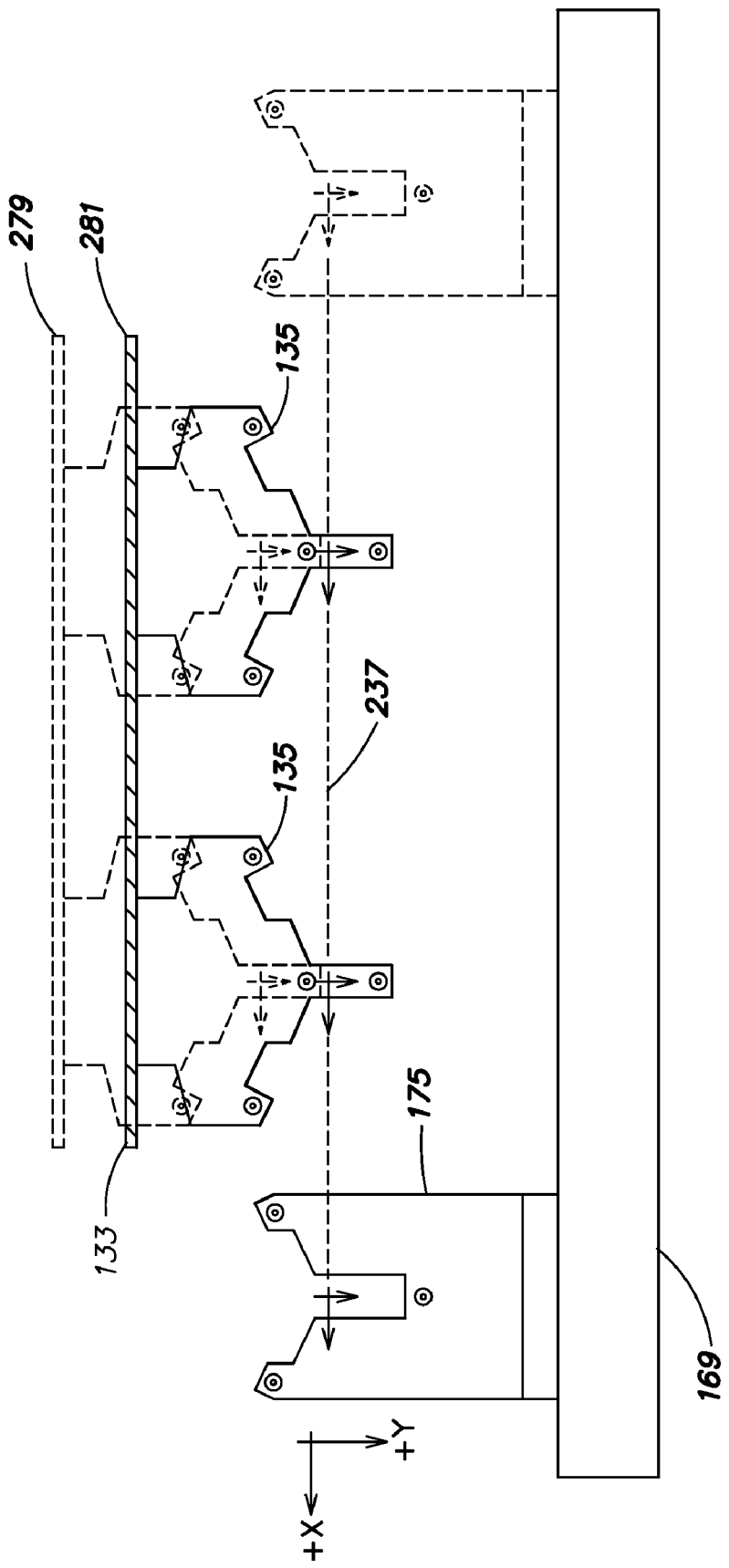
FIG. 19 is a top schematic view of a shelf support panel having two storage locations, and of an end effector, a horizontal guide, and a path through which the horizontal guide is adapted to guide the end effector.

FIG. 19 is a top schematic view of a shelf support panel 133 having two storage locations 135, and of the end effector 175, the horizontal guide 169, and the path 237 through which the horizontal guide 169 is adapted to guide the end effector 175. If desired, a y-axis position of the shelf support panel 133 relative to the path 237 may be adjusted (e.g., between a first position 279 and second position 281). The datum surface 131 (FIG. 1A) may be similarly adjusted for purposes of adjusting moveable portions (e.g., shelves 155) of the docking stations 127 to more closely align with the x-z plane. It should also be noted that if the shelf support panel 133 were mounted to the frame 157 of the high-speed loader 107 instead of the datum surface 131 of the factory interface 123, a similar adjustment may be used.

The foregoing description discloses only exemplary embodiments of the invention. Modifications of the above disclosed apparatus and methods which fall within the scope of the invention will be readily apparent to those of ordinary skill in the art. For instance, the sensor 243 (FIG. 11) and/or the sensor 253 (FIG. 13) can be any one of any number of sensors respectively adapted for the purpose of detecting the detectable feature 227 (FIG. 11) and the detectable feature 249 (FIG. 13). For example, a sensor may be utilized that is adapted to transmit a light beam along an axis and detect a reflection of (or the termination of a reflection of) that light beam. Alternatively, an optical-eye type sensor, or a through-beam sensor, may be utilized.

While the present invention has been described primarily with reference to wafers, it will be understood that the invention also may be employed with other substrates such as a silicon substrate, a glass plate, a mask, a reticule, etc., whether patterned or unpatterned; and/or with other apparatus for transporting and/or processing such substrates.

Any of the adjustments described herein may be performed manually, under computer control (e.g., under direction of the controller 178), or by a combination of the same. For example, one or more motors or other adjustment devices may be used to adjust the position of the high speed loader 107 (as described above) under control of an operator and/or the controller 178. Likewise, the controller 178 may include computer program code for carrying out or otherwise affecting one or more of the processes 600, 700, 800, 900, 1400, 1500, etc., described herein.

Accordingly, while the present invention has been disclosed in connection with exemplary embodiments thereof, it should be understood that other embodiments may fall within the spirit and scope of the invention, as defined by the following claims.

The invention claimed is:

1. A system comprising:
a substrate carrier loader adapted to load substrate carriers onto a moving conveyor, the moving conveyor adapted to transport substrate carriers through a manufacturing facility outside of a factory interface of a processing tool, the substrate carrier loader having an end effector adapted to move substrate carriers from a wafer carrier storage location or a docking station to the moving conveyor; and
a controller coupled to the substrate carrier loader, the controller adapted to assist in at least one of:
alignment of a travel path of the end effector of the substrate carrier loader to the moving conveyor, and
calibration of a position of the end effector of the substrate carrier loader to the moving conveyor or a storage location.

2. The system of claim 1 wherein the controller is adapted to detect detectable features of the moving conveyor so as to assist in at least one of:
adjustment of the pitch of a travel path of an end effector of the substrate carrier loader based on a pitch of the moving conveyor; and
adjustment of the lateral position of the travel path of the end effector of the substrate carrier loader based on a lateral position of the moving conveyor.

3. The system of claim 1 wherein the controller is adapted to receive signals generated by a launch sensor and determine from the received signals a substantially instantaneous speed of rotation of a band of the moving conveyor.

4. The system of claim 3 wherein the received signals comprise two pulses received in succession from the launch sensor and wherein the controller subtracts a time of a first pulse from a time of a second pulse to determine an interpulse time interval.

5. The system of claim 4 wherein the controller is adapted to calculate the substantially instantaneous speed of rotation by dividing a distance between detectable features formed on the band by the interpulse time interval.

6. The system of claim 1 further comprising a sensor adapted to provide at least one signal to the controller to assist in the alignment of the substrate carrier loader to the moving conveyor.

7. The system of claim 6 wherein the at least one signal is generated in response to a detectable feature.

8. The system of claim 6 wherein the sensor is an upward-looking sensor.

9. The system of claim 6 wherein the sensor generates at least one signal in response to detection of a detectable feature of or associated with the moving conveyor.

10. The system of claim 6 wherein the sensor generates a signal used for alignment of yaw of an end effector of a substrate carrier loader to yaw of the moving conveyor.

11. The system of claim 6 wherein the sensor generates a first signal at a first location and a second signal at a downstream location from the first location wherein the signals are used for a y-axis alignment of an end effector of a substrate carrier loader to the moving conveyor.

12. The system of claim 6 wherein the sensor is a side-looking sensor.

13. The system of claim 12 wherein the side-looking sensor generates a first signal and second signal which are used for alignment of pitch of the end effector of a substrate carrier loader to a pitch of the moving conveyor.

14. The system of claim 1 wherein the signal generated by the sensor is received by the controller and is used for a yaw alignment of an end effector of a substrate carrier loader to a yaw of the moving conveyor.

15. The system of claim 1 wherein the alignment of the substrate carrier loader to the moving conveyor comprises a sensor adapted to provide a signal to the controller in response to a detectable feature as the end effector of the substrate carrier loader is moved vertically.

16. The system of claim 1 further comprising a sensor adapted to generate a signal used in the calibration of the substrate carrier loader.

17. The system of claim 16 wherein the signal is determinative of a position of a carrier storage shelf or a carrier docking station.

18. The system of claim 1 further comprising a sensor adapted to provide a signal determinative of a vertical position of a carrier storage shelf or a carrier docking station.

19. A system comprising:

a substrate carrier loader adapted to load substrate carriers onto a moving conveyor, the moving conveyor adapted to transport substrate carriers through a manufacturing facility outside of a factory interface of a processing tool, the substrate carrier loader having an end effector adapted to move substrate carriers from a wafer carrier storage location or a docking station to the moving conveyor; and a controller coupled to the substrate carrier loader, the controller adapted to assist in alignment of a travel path of the end effector of the substrate carrier loader to the moving conveyor in at least two orientations selected from a group consisting of:

a pitch orientation, a yaw orientation, and a vertical orientation.

20. A system comprising:

a substrate carrier loader adapted to load substrate carriers onto a moving conveyor from a storage location, the moving conveyor adapted to transport substrate carriers through a manufacturing facility outside of a factory interface of a processing tool, the substrate carrier loader adapted to move substrate carriers from a wafer carrier storage location or a docking station to the moving conveyor;

a controller coupled to the substrate carrier loader, the controller adapted to assist in calibration of a position of the end effector of the substrate carrier loader to the moving conveyor or a storage location; and a sensor coupled to the controller and adapted to generate signals to be received by the controller wherein the signals are generated in response to detecting detectable features provided on the moving conveyor or the storage location.

* * * * *